United States Patent
Lee et al.

(10) Patent No.: US 9,224,441 B2
(45) Date of Patent: Dec. 29, 2015

(54) NONVOLATILE MEMORY DEVICE USING VARIABLE RESISTIVE ELEMENT AND MEMORY SYSTEM HAVING THE SAME

(71) Applicant: Samsung Electronics Co., Ltd., Suwon-si (KR)

(72) Inventors: Sung-Yeon Lee, Seoul (KR); Yeong-Taek Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 52 days.

(21) Appl. No.: 14/099,330

(22) Filed: Dec. 6, 2013

(65) Prior Publication Data
US 2014/0198556 A1 Jul. 17, 2014

(30) Foreign Application Priority Data
Jan. 14, 2013 (KR) .................. 10-2013-0004044

(51) Int. Cl.
| | |
|---|---|
| G11C 7/14 | (2006.01) |
| G11C 11/16 | (2006.01) |
| G11C 11/406 | (2006.01) |
| G11C 11/56 | (2006.01) |
| G11C 13/00 | (2006.01) |
| G11C 16/28 | (2006.01) |
| G11C 16/34 | (2006.01) |

(52) U.S. Cl.
CPC *G11C 7/14* (2013.01); *G11C 11/16* (2013.01); *G11C 11/406* (2013.01); *G11C 11/56* (2013.01); *G11C 13/0002* (2013.01); *G11C 13/0004* (2013.01); *G11C 13/004* (2013.01); *G11C 13/0033* (2013.01); *G11C 16/28* (2013.01); *G11C 16/3418* (2013.01); *G11C 2013/0054* (2013.01); *G11C 2213/71* (2013.01); *G11C 2213/72* (2013.01)

(58) Field of Classification Search
CPC ...... G11C 7/14; G11C 13/004; G11C 11/406; G11C 16/28; G11C 13/0033; G11C 13/0004; G11C 16/3418
USPC .................. 365/148, 171, 158, 209, 163, 222
See application file for complete search history.

(56) References Cited

U.S. PATENT DOCUMENTS

| | | | |
|---|---|---|---|
| 6,512,714 B2 | 1/2003 | Hanzawa et al. | |
| 6,819,589 B1 | 11/2004 | Aakjer | |
| 7,417,900 B2 | 8/2008 | Rolandi et al. | |
| 7,474,579 B2 | 1/2009 | Bill et al. | |
| 7,580,277 B2 * | 8/2009 | Fuji ...................... | G11C 11/406 365/148 |

(Continued)

FOREIGN PATENT DOCUMENTS

| | | |
|---|---|---|
| JP | 2009-140576 | 6/2009 |
| KR | 10-2010-0128376 A | 12/2010 |
| WO | WO 2011067795 A1 | 6/2011 |

*Primary Examiner* — Shawki S Ismail
*Assistant Examiner* — Muhammad Islam
(74) *Attorney, Agent, or Firm* — Myers Bigel Sibley & Sajovec, PA

(57) ABSTRACT

A nonvolatile memory device, which has an improved read reliability through a refresh operation, and a memory system, are provided. The nonvolatile memory device includes a resistive memory cell, a reference resistor corresponding to the resistive memory cell, a reference sense amplifier electrically connected to the reference resistor and configured to change a transition time of an output value of the reference resistor, and a refresh request signal generator configured to output the refresh request signal for the resistive memory cell when the transition time of an output value of the reference resistor is in a preset refresh requiring period.

16 Claims, 20 Drawing Sheets

(56) References Cited

U.S. PATENT DOCUMENTS

| | | |
|---|---|---|
| 7,613,038 B2 | 11/2009 | Takemura et al. |
| 7,751,227 B2 | 7/2010 | Fuji |
| 7,778,079 B2 | 8/2010 | Jeong et al. |
| 7,881,119 B2* | 2/2011 | Fukushima ............ G05F 3/262 365/185.21 |
| 7,940,552 B2 | 5/2011 | Chang-Wook et al. |
| 7,978,508 B2 | 7/2011 | Czubatyj |
| 8,228,721 B2 | 7/2012 | Lung |
| 2006/0265548 A1* | 11/2006 | Symanczyk et al. .......... 711/106 |
| 2009/0190409 A1 | 7/2009 | Dittrich et al. |
| 2010/0321987 A1* | 12/2010 | Lung .................. G11C 13/0004 365/163 |
| 2011/0013446 A1* | 1/2011 | Lung ............................ 365/163 |
| 2012/0063196 A1* | 3/2012 | Kim et al. ..................... 365/148 |
| 2012/0250402 A1* | 10/2012 | Song et al. .................... 365/163 |

* cited by examiner

FIG. 2

| 1_1 | 1_2 | 1_3 | 1_4 | 1_5 | 1_6 | 1_7 | 1_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(2_1) | | SA/WD(2_2) | | SA/WD(2_3) | | SA/WD(2_4) | |
| PERIPHERY(3) | | | | | | | |
| SA/WD(2_8) | | SA/WD(2_7) | | SA/WD(2_6) | | SA/WD(2_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 1_16 | 1_15 | 1_14 | 1_13 | 1_12 | 1_11 | 1_10 | 1_9 |

US 9,224,441 B2

NONVOLATILE MEMORY DEVICE USING VARIABLE RESISTIVE ELEMENT AND MEMORY SYSTEM HAVING THE SAME

CROSS-REFERENCE TO RELATED APPLICATION

This application claims priority from Korean Patent Application No. 10-2013-0004044 filed on Jan. 14, 2013 in the Korean Intellectual Property Office, and all the benefits accruing therefrom under 35 U.S.C. 119, the contents of which in its entirety are herein incorporated by reference.

FIELD

The present inventive concept relates to a nonvolatile memory device using a variable resistive element and a memory system comprising the same.

BACKGROUND

Nonvolatile memories using resistance materials include phase-change random access memories (PRAMs), resistive RAMs (RRAMs), and magnetic RAMs (MRAMs). While dynamic RAMs (DRAMs) or flash memories store data using charges, nonvolatile memories using resistance materials store data using a state change of a phase-change material, such as chalcogenide alloy (in the case of PRAMs), a resistance change of a variable resistance material (in the case of RRAMs), or a resistance change of a magnetic tunnel junction (MTJ) thin film according to a magnetization state of a ferromagnetic material (in the case of MRAMs).

In particular, a phase-change material of a PRAM becomes a crystalline state or an amorphous state as it is cooled after being heated. The phase-change material has low resistance in the crystalline state and has high resistance in the amorphous state. Therefore, the crystalline state may be defined as set data or data 0, and the amorphous state may be defined as reset data or data 1.

SUMMARY

The present inventive concept provides a nonvolatile memory device, which has an improved read reliability through a refresh operation.

The present inventive concept also provides a memory system, which has an improved read reliability through a refresh operation.

These and other objects of the present inventive concept will be described in or be apparent from the following description of the preferred embodiments.

According to an aspect of the present inventive concept, there is provided a nonvolatile memory device includes a resistive memory cell, a reference resistor corresponding to the resistive memory cell, a reference sense amplifier electrically connected to the reference resistor and configured to change a transition time of an output value of the reference resistor, and a refresh request signal generator configured to output the refresh request signal for the resistive memory cell when the transition time of an output value of the reference resistor is in a preset refresh requiring period.

According to another aspect of the present inventive concept, there is provided a nonvolatile memory device including a resistive memory cell, a reference resistor, which corresponds to the resistive memory cell and through which reference current flows, and a refresh request signal generator configured to compare the reference current with preset reference current and to generate a refresh request signal for the resistive memory cell according to the comparison result.

According to still another aspect of the present inventive concept, there is provided a memory system including a nonvolatile memory device including a resistive memory cell, a reference resistor corresponding to the resistive memory cell, a reference sense amplifier electrically connected to the reference resistor and changing a transition time of its output value according to a resistance value or a period of use of the reference resistor, and a refresh request signal generator configured to output a refresh request signal based on the transition time of the output value, and a controller configured to receive the refresh request signal and to refresh the resistive memory cell.

BRIEF DESCRIPTION OF THE DRAWINGS

The above and other features and advantages of the present inventive concept will become more apparent by describing in detail preferred embodiments thereof with reference to the attached drawings in which:

FIG. 2 is a block diagram of a nonvolatile memory device according to some embodiments of the present inventive concept;

DETAILED DESCRIPTION OF THE EMBODIMENTS

Figure 1:
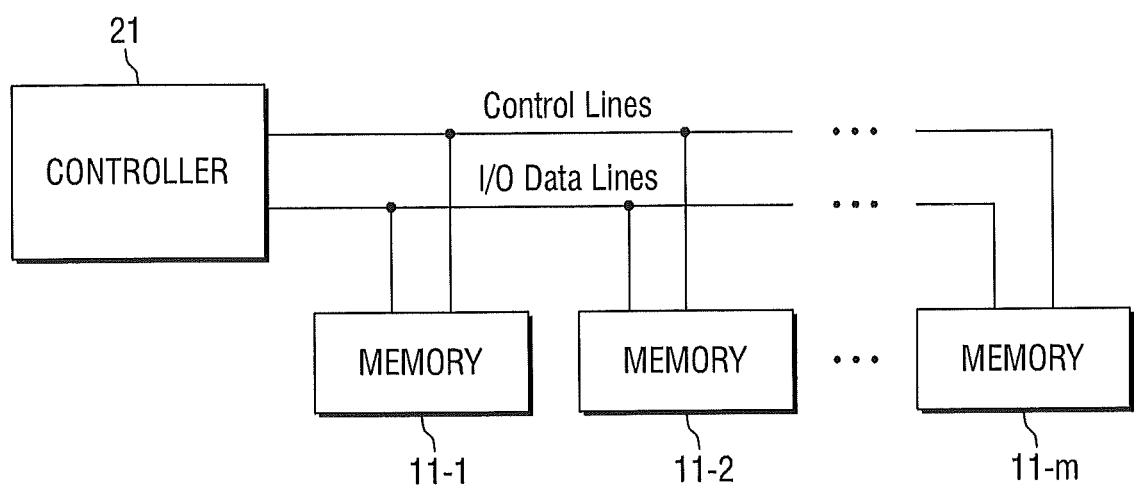
FIG. 1 is a block diagram of a memory system according to some embodiments of the present inventive concept.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known methods, procedures, components, and circuitry have not been described in detail to avoid unnecessarily obscuring aspects of the present invention.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "comprising," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, exemplary embodiments of the present inventive concept will be described using a phase-change random access memory (PRAM). However, the present inventive concept can be applied to all nonvolatile memories using resistance materials, such as resistive RAMs and magnetic RAMs.

FIG. 1 is a block diagram of a memory system according to some embodiments of the present inventive concept.

Referring to FIG. 1, the memory system according to some embodiments of the present inventive concept includes a plurality of memory devices 11_1 to 11_m, where m is a natural number, and a controller 21.

The plurality of memory devices 11_1 to 11_m and the controller 21 are connected to each other through control lines and I/O data lines. For example, the controller 21 may provide various commands (e.g., a write command, a read command, etc.) to the plurality of memory devices 11_1 to 11_m through the control lines. In addition, the controller 21 and the plurality of memory devices 11_1 to 11_m may exchange data through the I/O data lines.

In the illustrated embodiment, the plurality of memory devices 11_1 to 11_m share the control lines and the I/O data lines, but aspects of the present inventive concept are not limited thereto. For example, the plurality of memory devices 11_1 to 11_m may share only the I/O data lines but may not share the control lines.

Meanwhile, the plurality of memory devices 11_1 to 11_m may include various kinds of memories. The plurality of memory devices 11_1 to 11_m may include, for example, a volatile memory device, such as a DRAM, and a nonvolatile memory device, such as a NAND flash, or a NOR flash. In addition, the plurality of memory devices 11_1 to 11_m may include a nonvolatile memory device using a resistive element (i.e., a resistive memory device) such as a PRAM, RRAM, or MRAM.

In particular, as will later be described, in memory systems according to some embodiments of the present inventive concept, the controller 21 may control a resistive memory device to perform a refresh operation (e.g., auto refresh or selective refresh). That is to say, after the resistive memory device is turned on, the overall resistive memory cell is auto refreshed at any particular time point by counting a predetermined time. Alternatively, the controller 21 may receive a refresh request signal FLAGR from the resistive memory device and may control the resistive memory device to perform a selective refresh operation at an appropriate timing. The selective refresh operation will later be described in detail with reference to FIGS. 5 to 18B.

FIG. 2 is a block diagram of a nonvolatile memory device according to some embodiments of the present inventive concept. For brevity, FIG. 2 illustrates a nonvolatile memory device including 16 memory banks by way of example, but aspects of the present inventive concept are not limited thereto.

Referring to FIG. 2, the nonvolatile memory device according to some embodiments of the present inventive concept includes a memory cell array, a plurality of sense amplifiers and write drivers 2_1 to 2_8, and a peripheral circuit area (PERIPHERY) 3.

The memory cell array may include a plurality of plurality of memory banks 1_1 to 1_16, each of the memory banks 1_1 to 1_16 may include a plurality of memory blocks BLK0 to BLK7, and each of the memory blocks BLK0 to BLK7 may include a plurality of nonvolatile memory cells arrayed in a matrix type. In the present embodiments, each 8 memory blocks are arrayed, but aspects of the present inventive concept are not limited thereto.

In addition, although not shown, row select circuits and column select circuits defining rows and columns of resistive memory cells to be written/read are arranged to correspond to the memory banks 1_1 to 1_16.

The plurality of sense amplifiers and write drivers 2_1 to 2_8 are arranged to correspond to two of the memory banks 1_1 to 1_16 and perform read and write operations in the corresponding memory banks. In the embodiments of the present inventive concept, the sense amplifiers/write drivers 2_1 to 2_8 correspond to two of the memory banks 1_1 to 1_16, but aspects of the present inventive concept are not limited thereto. That is to say, the plurality of sense amplifiers and write drivers 2_1 to 2_8 may also be arranged to correspond to one or four memory banks.

A plurality of logic circuit blocks and a voltage generator for operating the column select circuits, the row select blocks, the plurality of sense amplifiers/write drivers 2_1 to 2_8, etc. may be arranged in the peripheral circuit region 3.

Figure 3:
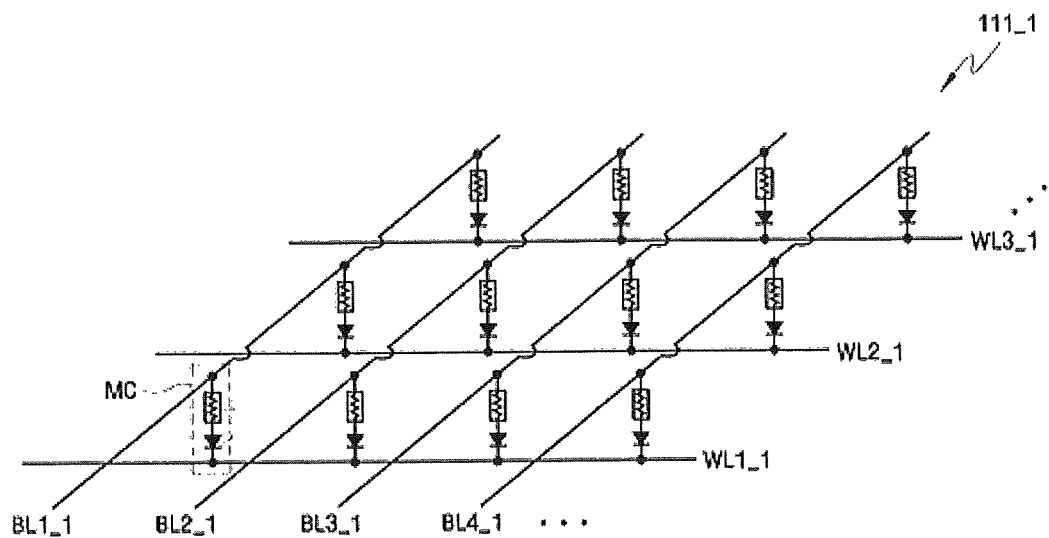
FIGS. 3 and 4 illustrate a memory cell array shown in FIG. 2.
Figure 4:
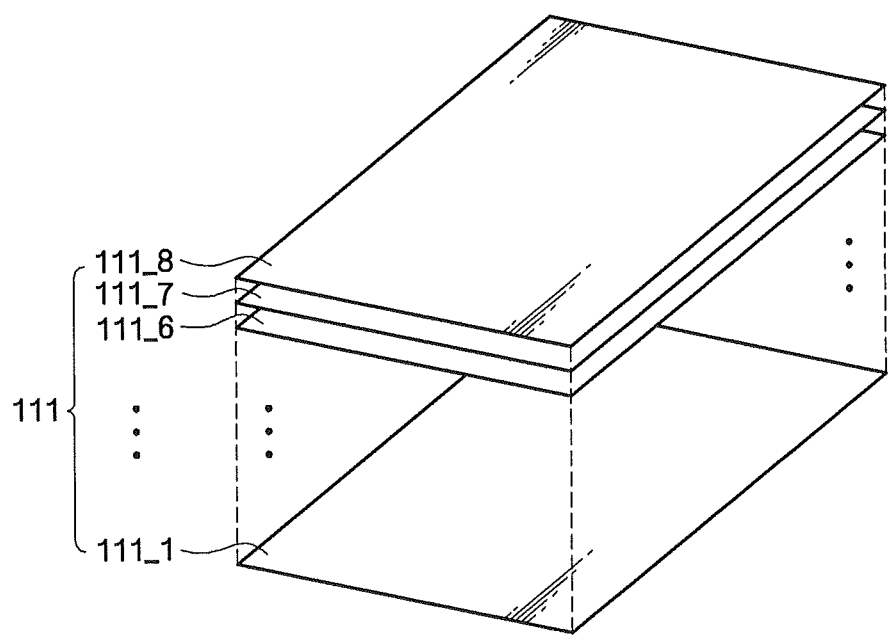

FIGS. 3 and 4 illustrate a memory cell array shown in FIG. 2.

Referring to FIG. 3, the memory cell array may have a cross point structure. The cross point structure may be a structure in which a memory cell is formed at an intersection of one line and another. For example, bit lines BL1_1 to BL4_1 are formed to extend in a first direction, word lines WL1_1 to WL3_1 are formed to extend in a second direction so as to cross the bit lines BL1_1 to BL4_1, and resistive memory cells MC may be formed at intersections of bit lines BL1_1 to BL4_1 and the word lines WL1_1 to WL3_1.

Alternatively, as shown in FIG. 4, the memory cell array may have a three-dimensional (3D) stacked structure. The 3D stacked structure may be a structure in which a plurality of memory cell layers 111_1 to 111_8 is vertically stacked. Eight memory cell layers 111_1 to 111_8 stacked vertically are exemplified in FIG. 4, but aspects of the present inventive concept are not limited thereto. Here, each of the memory cell layers 111_1 to 111_8 may include a plurality of memory cell groups and/or a plurality of redundancy memory cell groups. In a case where the memory cell array has a 3D stacked structure, each of the memory cell layers 111_1 to 111_8 may have a cross point structure shown in FIG. 3, but aspects of the present inventive concept are not limited thereto.

Figure 5:
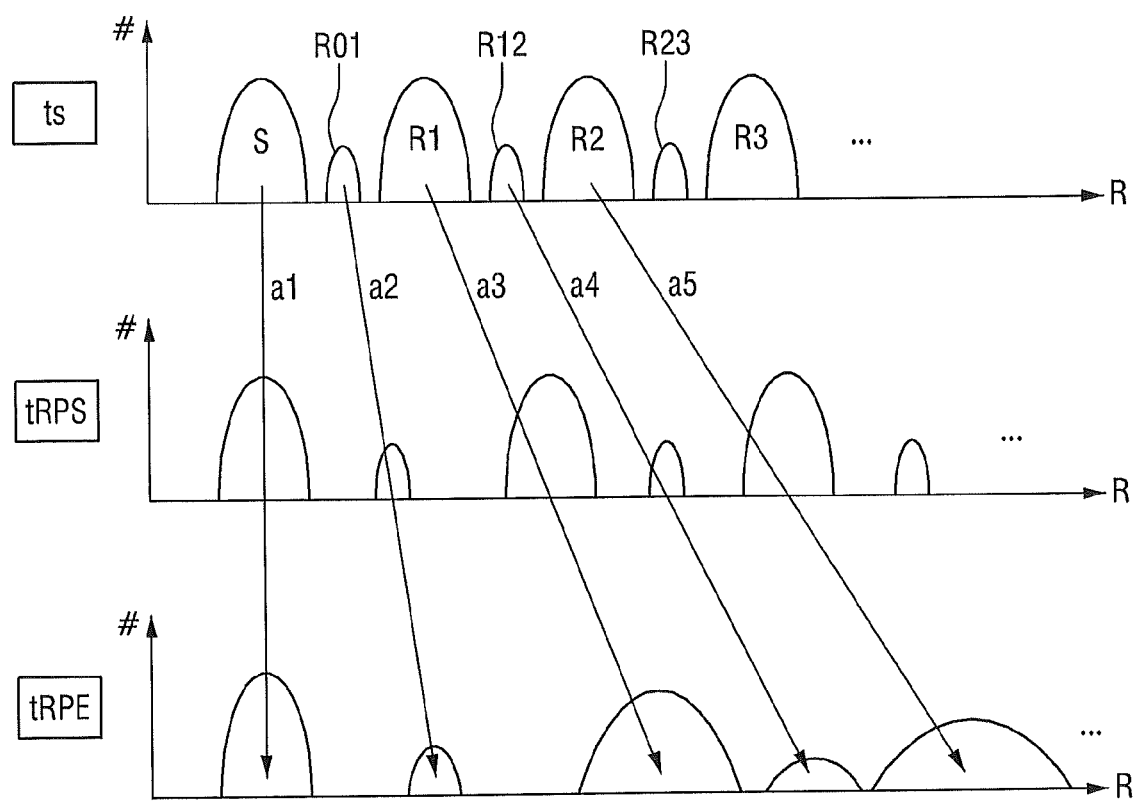
FIG. 5 illustrates a resistance distribution of resistive memory cells used in the nonvolatile memory device according to some embodiments of the present inventive concept.

FIG. 5 illustrates a resistance distribution of resistive memory cells used in the nonvolatile memory device according to some embodiments of the present inventive concept. In FIG. 5, multi-bit cells storing 2-bit data are exemplified, but aspects of the present inventive concept are not limited thereto. That is to say, the present inventive concept may also be applied to multi-bit cells storing data of more than 3 bits. In FIG. 5, the X axis indicates the resistance value, and the Y axis indicates the number of memory cells.

First, immediately after performing a write operation ts, first data S to fourth data R3 are sequentially arranged. In addition, reference resistor R01 is arranged between the first data S and second data R1, reference resistor R12 is arranged between the second data R1 and third data R2, and reference resistor R23 is arranged between the third data R2 and fourth data R3. As will later be described, the reference resistors R01, R12 and R23 may be used as reference values for discriminating data during a read operation period.

Next, as indicated by arrows a1 to a5, the first data S to the fourth data R3 and the reference resistors R01, R12 and R23 vary with time after performing a write operation, which is referred to as resistance drift.

For example, if a first time tRPS is elapsed after performing a write operation, intervals between each of the first data S to the fourth data R3 and between each of the reference resistors R01, R12 and R23 are increased and are not constant.

In addition, if a second time tRPE is elapsed after performing a write operation, intervals between each of the first data S to the fourth data R3 and between each of the reference resistors R01, R12 and R23 are further increased. Further, distribution widths of the first data S to the fourth data R3 and the reference resistors R01, R12 and R23 are increased and are not constant.

As described above, the resistance drift may occur with the elapse of time after a write operation or with the change in the operating environments, such as time or temperature. The resistance drift changes intervals between each of the first data S to the fourth data R3 and between each of the reference resistors R01, R12 and R23 or distribution widths of the first data S to the fourth data R3 and the reference resistors R01, R12 and R23, thereby lowering the reliability of a read operation. As will later be described, in the nonvolatile memory device according to some embodiments of the present inventive concept, the reliability of a read operation can be improved using a refresh operation (e.g., an auto refresh operation or a selective refresh operation).

Figure 6:
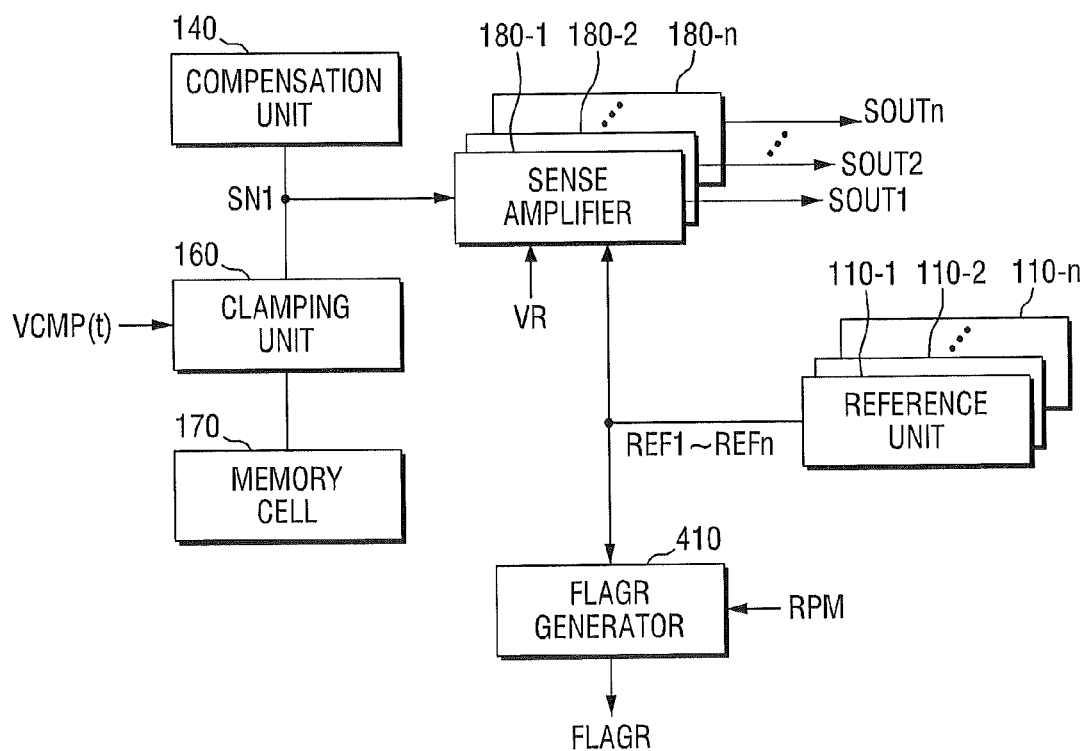
FIG. 6 is a block diagram of a nonvolatile memory device according to an embodiment of the present inventive concept.
Figure 7:
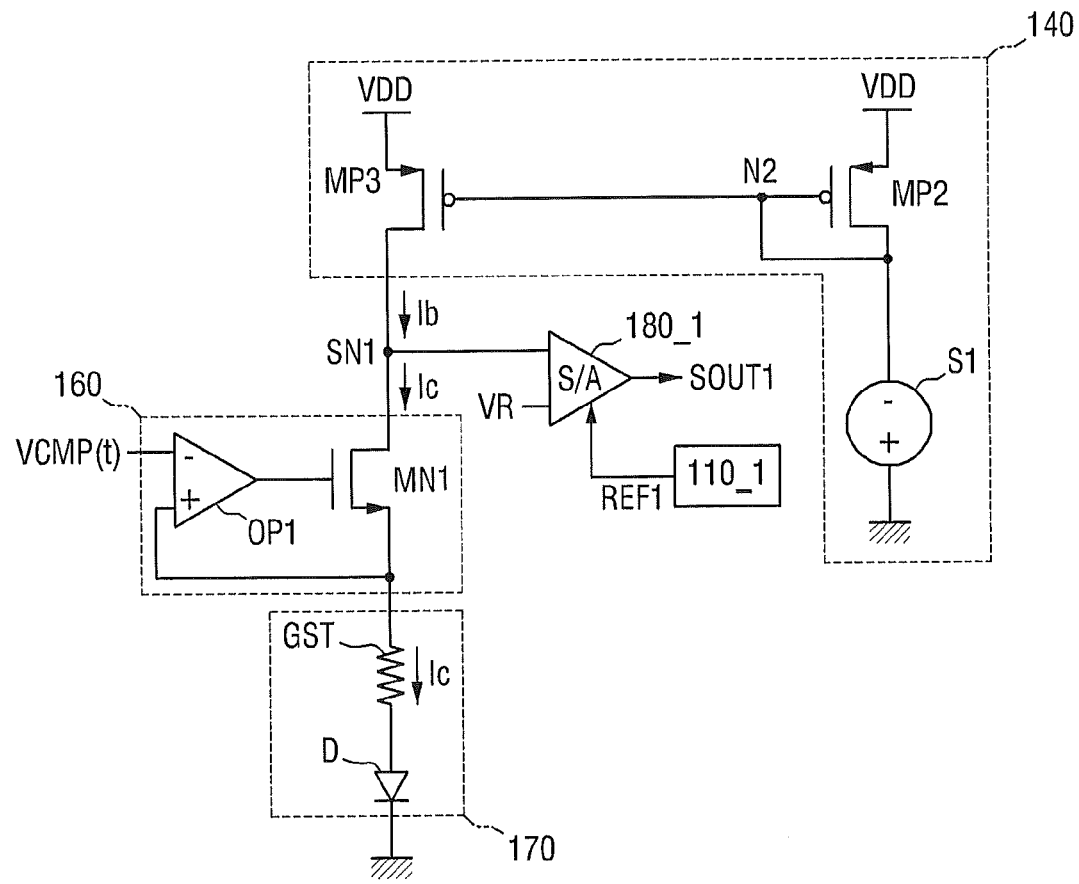
FIG. 7 is an exemplary circuit view of the nonvolatile memory device shown in FIG. 6.

FIG. 6 is a block diagram of a nonvolatile memory device according to an embodiment of the present inventive concept, and FIG. 7 is an exemplary circuit view of the nonvolatile memory device shown in FIG. 6. For, brevity, FIG. 7 shows only one first sense amplifier 180_1 and one reference unit 110_1.

First, referring to FIGS. 6 and 7, the nonvolatile memory device according to an embodiment of the present inventive concept includes a resistive memory cell 170, a first sensing node SN1, a first compensation unit 140, a first clamping unit 160, first sense amplifiers (or normal sense amplifiers) 180_1 to 180_n, where n is a natural number), reference units 110_1 to 110_n, and a refresh request signal generator 410.

The resistive memory cell 170 shown in FIGS. 6 and 7 is a resistive memory cell selected among the plurality of resistive memory cells in the memory cell array. Here, in a case where the resistive memory cell 170 is a PRAM, the resistive memory cell 170 may include a variable resistive element GST including a phase change material, and an access element D controlling the current flowing through the variable resistive element GST. Here, the access element D may be a diode or a transistor connected to the variable resistive element GST in series. In addition, the phase change material may have a different resistance value according to a crystalline state or an amorphous state. For example, the phase-change material may be a combination of two elements, such as GaSb, InSb, InSe, $Sb_2Te_3$ or GeTe, a combination of three elements, such as GeSbTe, GaSeTe, InSbTe, $SnSb_2Te_4$ or InSbGe, or a combination of four elements such as AgInSbTe, (GeSn)SbTe, GeSb(SeTe) or $Te_{81}Ge_{15}Sb_2S_2$. Specifically, GeSbTe including germanium (Ge), antimony (Sb) and tellurium (Te) may be used.

Meanwhile, in a case where the resistive memory cell 170 is an RRAM, the variable resistive element GST may include, for example, NiO or perovskite. The perovskite may be a composition of manganite (such as $Pr_{0.7}Ca_{0.3}MnO_3$, $Pr_{0.5}Ca_{0.5}MnO_3$, PCMO, and LCMO), titanate (such as STO:

Cr), and/or zirconate (such as SZO: Cr, Ca$_2$Nb$_2$O$_7$: Cr, and Ta$_2$O$_5$: Cr). A filament may be formed in the variable resistive element GST and may correspond to a current path for cell current flowing through the resistive memory cell 170.

The first compensation unit 140 provides first compensation current Ib to the first sensing node SN1. In detail, the compensation unit 140 provides the first compensation current Ib to the first sensing node SN1 to compensate for a level reduction in the first sensing node SN1, which is caused by the cell current Ic flowing through the selected resistive memory cell 170. As shown, the first compensation unit 140 may include a PMOS transistor MP1 connected between a power voltage VDD and the first sensing node SN1 and a PMOS transistor MP2 and a source S1 connected between the power voltage VDD and a ground voltage. Gates of the PMOS transistors MP1 and MP2 are connected to each other and the PMOS transistors MP1 and MP2 may be in forms of current mirrors.

In the nonvolatile memory device according to some embodiments of the present inventive concept, even if multi-bit data is stored in the resistive memory cell 170, the first compensation current Ib may be constant during a read operation. For example, the first compensation current Ib used to check whether the first data (S of FIG. 5) is stored in the resistive memory cell 170 and the first compensation current Ib used to check whether the third data (R2 of FIG. 5) is stored in the resistive memory cell 170 may be equal to each other.

The first clamping unit 160 is connected between the resistive memory cell 170 and the first sensing node SN1 and clamps levels of bit lines to be in an appropriate range for a read operation. In detail, the first clamping unit 160 clamps levels of bit lines to a predetermined level lower than a threshold voltage Vth of a variable resistive element. If the bit line level exceeds the threshold voltage Vth, a phase of the variable resistive element of the selected resistive memory cell 170 may change. As shown, the first clamping unit 160 may include an NMOS transistor MN1 connected between the resistive memory cell 170 and the first sensing node SN1 and an OP amplifier OP1.

In the nonvolatile memory device according to some embodiments of the present inventive concept, the first clamping unit 160 provides a clamping bias VCMP(t) to the resistive memory cell 170. In particular, the clamping bias VCMP(t) may vary with time during a read operation. The clamping bias VCMP(t) may exhibit various forms. For example, the clamping bias VCMP(t) may be increased with time. Alternatively, the clamping bias VCMP(t) may be increased stepwise with time. The clamping bias VCMP(t) may also be increased with time in the form of a kth-order equation, where k is a natural number.

The plurality of first sense amplifiers 180_1 to 180_n are connected to the first sensing node SN1 and may sense a change in the level of the first sensing node SN1. Each of the plurality of first sense amplifiers 180_1 to 180_n performs a sensing operation in response to enable signals REF1 to REFn activated at different timings. The enable signals REF1 to REFn may be output values of the plurality of first sense amplifiers 180_1 to 180_n.

In detail, the first sense amplifiers 180_1 to 180_n compare the level of the first sensing node SN1 with a reference level VR and output the comparison result. The first sense amplifiers 180_1 to 180_n may be current sense amplifiers or voltage sense amplifiers. Each of the plurality of first sense amplifiers 180_1 to 180_n may read corresponding data. For example, the first sense amplifier 180_1 may read the second data R1 and the first sense amplifier 180_2 may read the third data R2.

Meanwhile, in the nonvolatile memory device according to some embodiments of the present inventive concept, the first sense amplifiers 180_1 to 180_n may have different transition timing points of output values SOUT1 to SOUTn of the first sense amplifiers 180_1 to 180_n according to the data stored in the resistive memory cell 170.

For example, when the resistive memory cell 170 stores the second data (e.g., R1), the output value SOUT1 of the first sense amplifier 180_1 may transition (e.g., from an H state to an L state) at the first time (A of FIG. 9) after the time of starting providing of the first clamping bias VCMP(t). On the other hand, when the resistive memory cell 170 stores third data (e.g., R2) different from the second data (e.g., R1), the output value SOUTn of the first sense amplifier 180_n may transition at the second time (B of FIG. 10) after the time of starting providing of the first clamping bias VCMP(t), which will later be described in more detail with reference to FIGS. 9 and 10.

Each of the plurality of reference units 110_1 to 110_n generates enable signals REF1 to REFn activated at different timings during a read operation period to control the plurality of first sense amplifiers 180_1 to 180_n. The reference units 110_1 to 110_n will be described in more detail with reference to FIGS. 8 and 11.

The refresh request signal generator 410 may receive the plurality of enable signals REF1 to REFn and a refresh period mask signal RPM and may provide a refresh request signal FLAGR indicating whether the resistive memory cell 170 needs to be refreshed or not.

As will later be described, the refresh period mask signal RPM is a signal indicative of a refresh requiring period. The refresh requiring period may be determined in advance through a test operation. That is to say, the refresh requiring period may be a preset value determined before performing a read operation. The process of determining the refresh period mask signal RPM will later be described with reference to FIG. 12.

In addition, when the enable signals REF1 to REFn overlap with the refresh period mask signal RPM (that is, when the enable signals REF1 to REFn are within the preset refresh requiring period), the refresh request signal FLAGR may be generated, which will later be described with reference to FIGS. 13 and 14.

Meanwhile, the controller (21 of FIG. 1) may receive the refresh request signal FLAGR and stores the data and address of the resistive memory cell 170 corresponding to the refresh request signal FLAGR. The controller 21 may control the nonvolatile memory device to perform a refresh operation while providing the data and address stored at appropriate timings (for example, when the nonvolatile memory device is ready). That is to say, the nonvolatile memory device may re-write the data stored in the resistive memory cell corresponding to the stored address.

Figure 8:
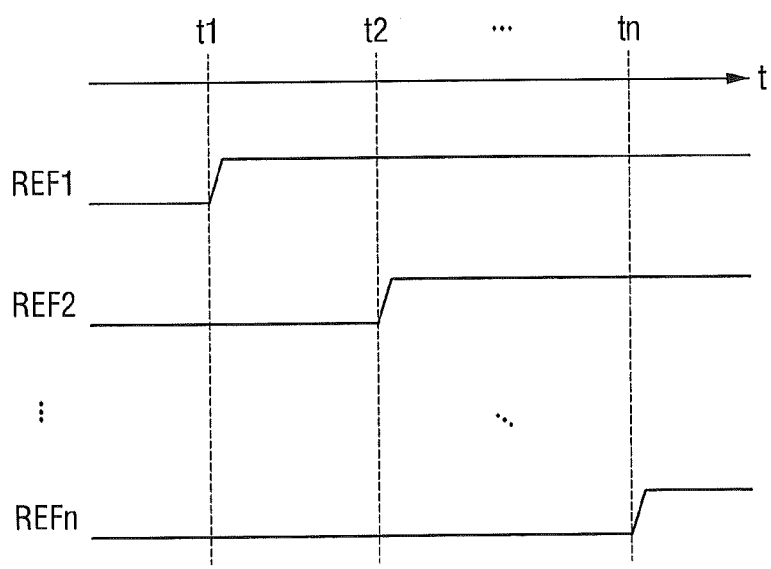
FIG. 8 is an exemplary timing diagram of the reference unit shown in FIG. 6.

FIG. 8 is an exemplary timing diagram of the reference unit shown in FIG. 6.

Referring to FIG. 8, at a time t1, a first reference output signal REF1 of the first reference unit 110_1 is activated and a second reference output signal REF2 of the second reference unit 110_2 is activated. In addition, at a time tn, an nth reference output signal REFn of the nth reference unit 110_n is activated.

Figure 11:
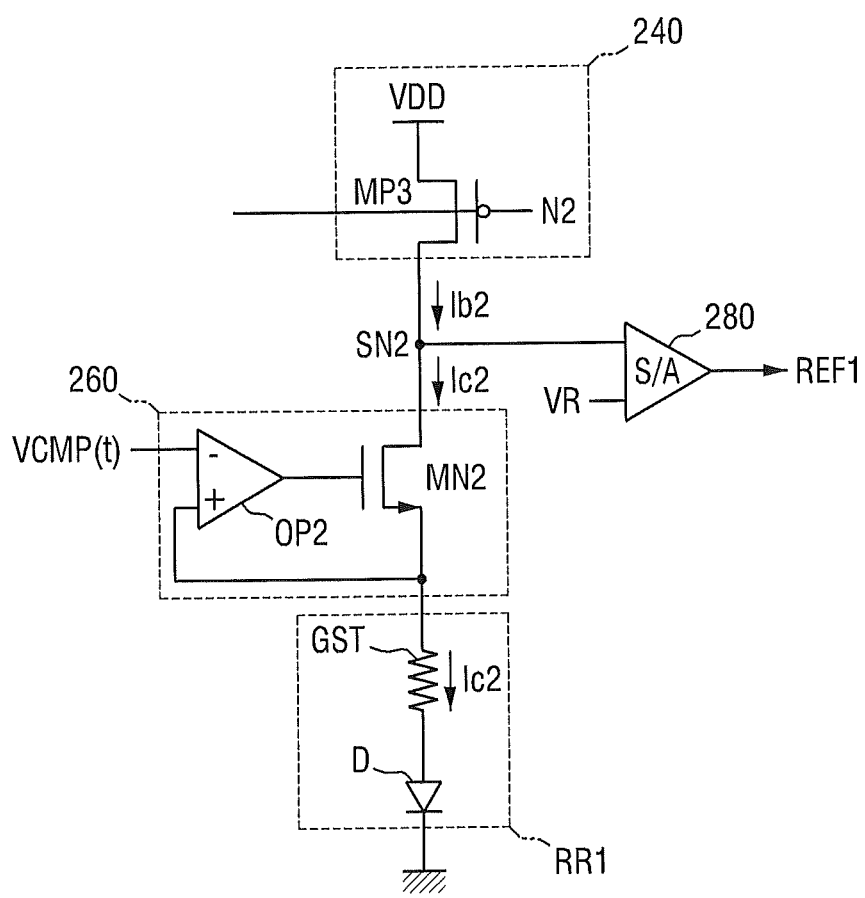
FIG. 11 is an exemplary circuit view of the reference unit shown in FIG. 6.

The respective reference units 110_1 to 110_n may include different reference resistance values. Activation timings of the respective reference output signals REF1 to REFn may be different from each other according to the resistance values of the reference resistors. An exemplary configuration of the reference unit 110_1 is shown in FIG. 11.

Figure 9:
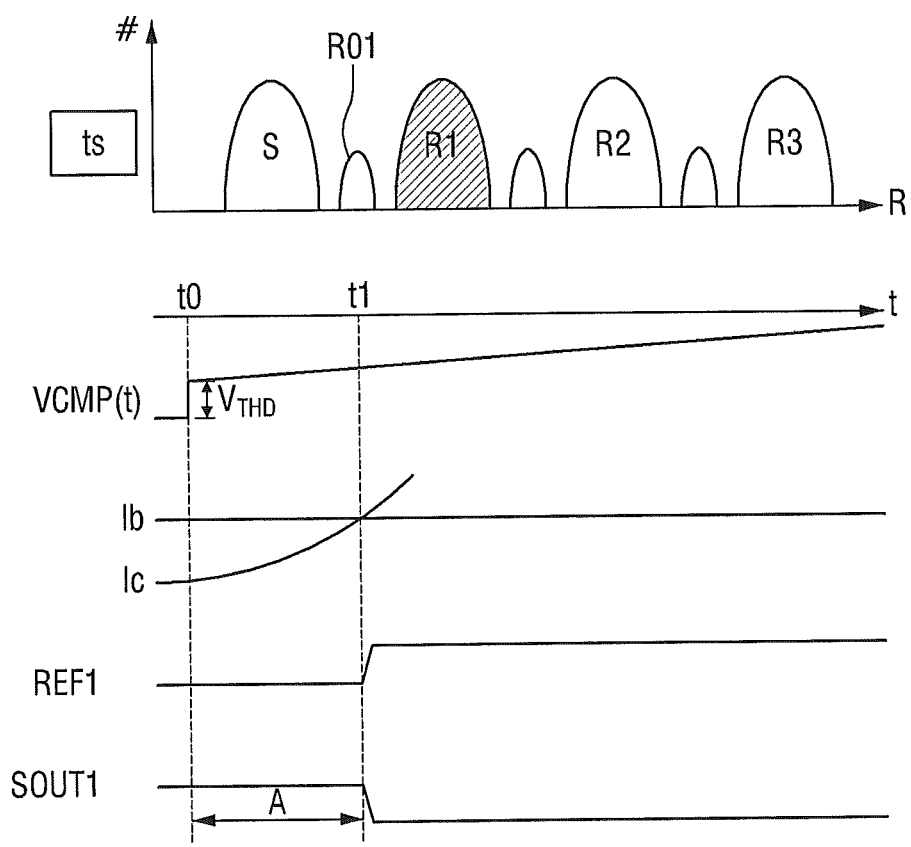
FIGS. 9 and 10 are timing diagrams of a driving method of a nonvolatile memory device according to some embodiments of the present inventive concept.
Figure 10:
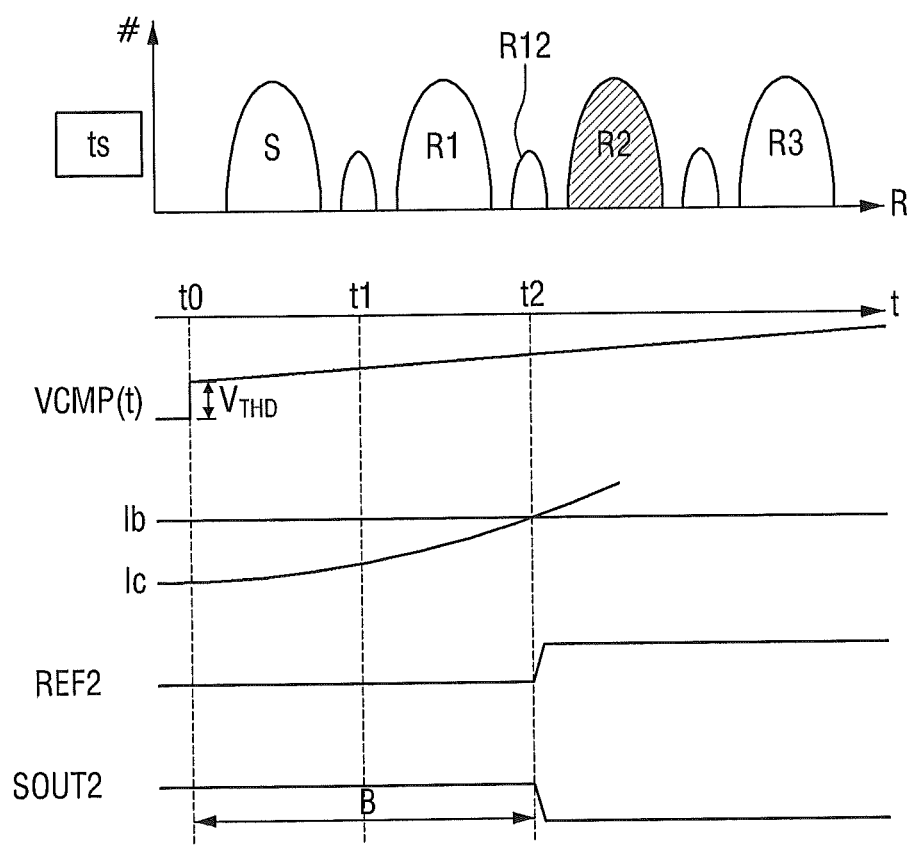

FIGS. 9 and 10 are timing diagrams of a driving method of a nonvolatile memory device according to some embodiments of the present inventive concept. In FIGS. 9 and 10, a normal read operation is illustrated, specifically a read operation performed immediately after performing a write operation (at a time is of FIG. 5).

FIG. 9 is a timing diagram of the driving method of the nonvolatile memory device according to some embodiments of the present inventive concept in a case where the resistive memory cell 170 stores second data R1.

Referring to FIG. 9, the read operation is started from a time t0 and a clamping bias VCMP(t) is enabled. As shown in FIG. 9, an initial value of the clamping bias VCMP(t) may be a threshold voltage $V_{THD}$ of an access element D of the resistive memory cell 170. The first compensation current Ib is maintained to be constant, and the clamping bias VCMP(t) is increased with time. As the clamping bias VCMP(t) is increased, the cell current Ic passing through the resistive memory cell 170 starts to increase. Meanwhile, when the first compensation current Ib is greater than the cell current Ic, the output value SOUT1 of the first sense amplifier 180_1 is maintained at a logic high.

Next, when a time t1 is reached, the increasing cell current Ic is increased by the first compensation current Ib, so that it eventually becomes greater than the first compensation current Ib. Thus, the level of the first sensing node SN1 starts to vary. Here, the enable signal REF1 is activated.

The first sense amplifier 180_1 is enabled in response to the enable signal REF1 and senses a change in the level of the first sensing node SN1. Therefore, the output value SOUT1 of the first sense amplifier 180_1 transitions from a logic high to a logic low.

Here, when the resistive memory cell 170 stores the second data R1, the output value SOUT1 of the first sense amplifier 180_1 transitions at a first time A after the time t0 of starting providing of the first clamping bias VCMP(t).

FIG. 10 is a timing diagram of the driving method of the nonvolatile memory device according to some embodiments of the present inventive concept in a case where the resistive memory cell 170 stores third data R2. The same operation and element descriptions as those of FIG. 9 will be omitted.

Referring to FIG. 10, the read operation is started from a time t0. The first compensation current Ib is maintained to be constant, and the clamping bias VCMP(t) is increased with time. As the clamping bias VCMP(t) is increased, the cell current Ic starts to increase. However, because the first compensation current Ib is greater than the cell current Ic, the output value SOUT2 of the first sense amplifier 180_2 is maintained at a logic high.

Next, even when the time t1 is reached, the first compensation current Ib is still greater than the cell current Ic. Therefore, the output value SOUT2 of the first sense amplifier 180_2 is maintained at logic high.

Then, when a time t2 is reached, the increasing cell current Ic is increased by the first compensation current Ib, so that it eventually becomes greater than the first compensation current Ib. Thus, the level of the first sensing node SN1 starts to vary. Here, the enable signal REF2 corresponding to the reference resistor R12 is activated. The first sense amplifier 180_2 is enabled in response to the enable signal REF1 and senses a change in the level of the first sensing node SN1. Therefore, the output value SOUT2 of the first sense amplifier 180_2 makes transition from a logic high to a logic low.

Here, when the resistive memory cell 170 stores the third data R2, the output value SOUT2 of the first sense amplifier 180_2 transitions at a second time B after the time t0 of starting providing of the first clamping bias VCMP(t).

As shown in FIGS. 9 and 10, the plurality of enable signals REF1 to REFn are sequentially activated according to the level transition timing point of the first sensing node SN1 during a normal read operation. To generate the enable signals REF1 to REFn, the reference units 110_1 to 110_n may include the reference resistors having different resistance values. The reference resistor may be a resistive memory cell. As described above with reference to FIG. 5, if a predetermined time is elapsed after a write operation is performed, the resistive memory cell 170 deteriorates so that a resistance value of the resistive memory cell 170 may be changed. Accordingly, to activate the plurality of enable signals REF1 to REFn in consideration of the change, the resistive memory cell may be used as the reference resistor. The reference unit including a resistive memory cell will now be described with reference to FIG. 11.

FIG. 11 is an exemplary circuit view of the reference unit shown in FIG. 6.

Referring to FIG. 11, a reference unit (e.g., 110_1) may include a reference resistor RR1, a second sensing node SN2, a second clamping unit 260, a second compensation unit 240, and a second sense amplifier (or a reference sense amplifier) 280.

The reference resistor (e.g., RR1) may have the same configuration as the resistive memory cell 170. That is to say, the reference resistor RR1 may include a variable resistive element GST including a phase change material, and an access element D controlling the current flowing through the variable resistive element GST.

The second compensation unit 240 may provide a second compensation current Ib2 to a second sensing node SN2. The second compensation unit 240 includes a PMOS transistor MP3 connected to a power voltage VDD and the second sensing node SN2, and a gate of the PMOS transistor MP3 is connected to node N2 of the first compensation unit 140. That is to say, the PMOS transistors MP1 and MP2 of the first compensation unit 140 and the PMOS transistor MP3 of the second compensation unit 240 may be connected to the same node. Thus, the first compensation current Ib and the second compensation current Ib2 may be equal to each other. That is to say, while data stored in the multi-bit cell resistive memory cell 170 is read, the first compensation current Ib and the second compensation current Ib2 may be maintained to be substantially constant.

The second clamping unit 260 is connected between the reference resistor RR1 and the second sensing node SN2. The second clamping unit 260 may include an NMOS transistor MN2 and an OP amplifier OP2. Here, the second clamping unit 260 provides a clamping bias VCMP(t) to the reference resistor RR1. During a read operation period of the clamping bias VCMP(t), the clamping bias VCMP(t) may vary with time. For example, the clamping bias VCMP(t) may be increased with time. The clamping bias VCMP(t) may be increased stepwise with time. The clamping bias VCMP(t) may also be increased with time in the form of a kth-order equation, where k is a natural number.

The second sense amplifier 280 is connected to the second sensing node SN2 and senses a level change of the second sensing node SN2. In detail, the second sense amplifier 280 compares a level of the second sensing node SN2 with a reference level VR and outputs the enable signal REF1.

Figure 12:
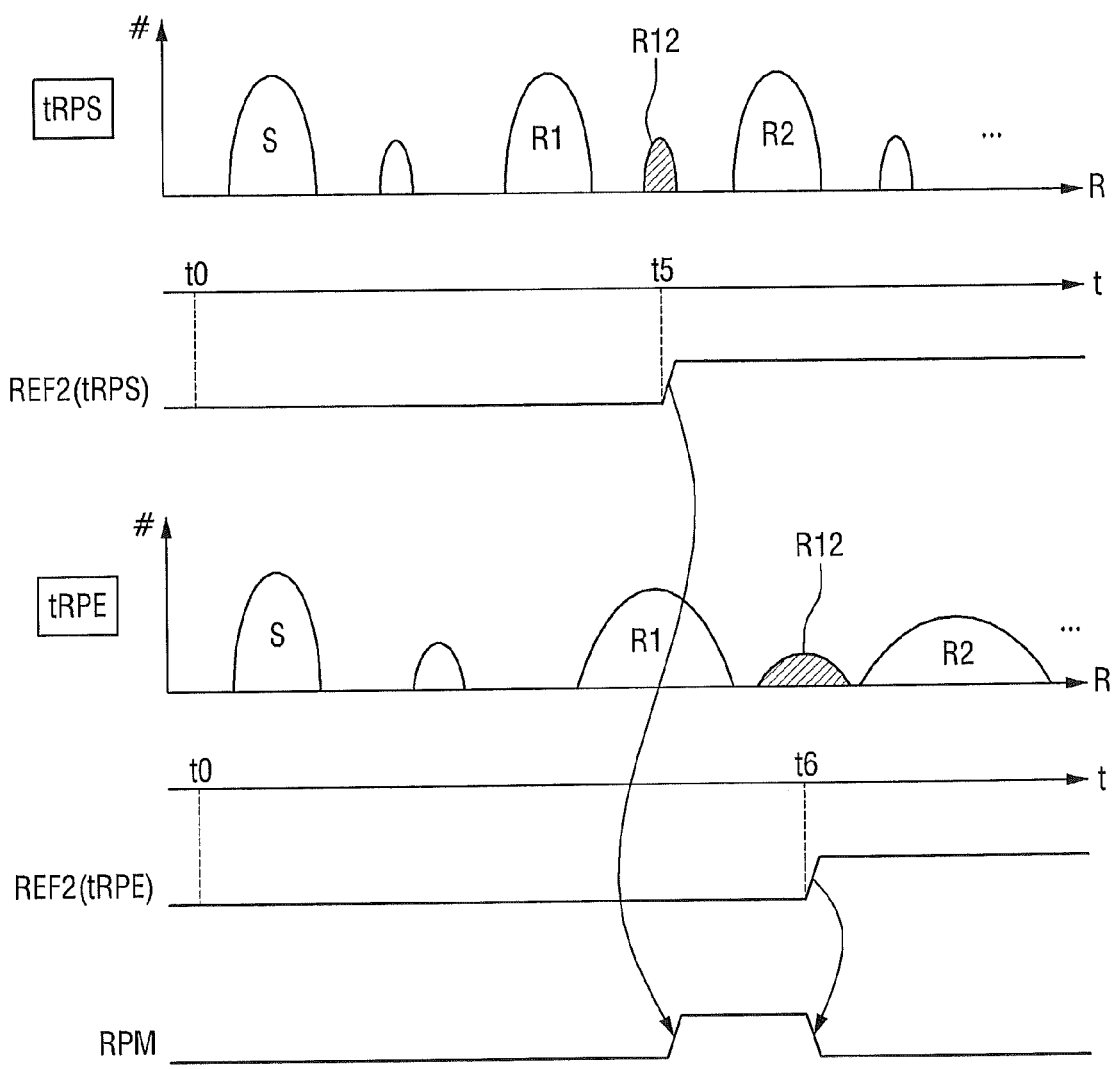
FIG. 12 illustrates a process of determining the refresh period mask signal RPM shown in FIG. 6.

FIG. 12 illustrates a process of determining the refresh period mask signal RPM shown in FIG. 6. After (or when) manufacturing a nonvolatile memory device, the refresh period mask signal RPM may be determined through a test operation shown in FIG. 12.

As described above with reference to FIG. 10, immediately after the time is of performing a write operation, the enable signal REF2 corresponding to the reference resistor R12 is activated at a time t2. That is to say, the enable signal REF2 is activated at the second time B after the time t0 of starting providing of the clamping bias VCMP(t).

However, the reference resistor R12 is increased by resistance drift with the elapse of time. If a predetermined time is elapsed, the timing of activating the enable signal REF2 also varies.

However, it is not necessary to perform a refresh operation until the first time tRPS is reached immediately after performing the write operation. After the first time tRPS, it is necessary to perform the refresh operation. However, if the second time tRPE greater than the first time tRPS is elapsed, it is not necessary to perform the refresh operation. That is to say, even if the refresh operation is performed, data recovery is difficult to achieve.

Therefore, a period ranging from the first time tRPS to the second time tRPE is a refresh requiring period. That is to say, the first time tRPS is a start time from which a refresh operation is required, and the second time tRPE is a time after which a refresh operation is no longer required. The first time tRPS and the second time tRPE may be obtained through a test operation.

Referring to FIG. 12, at the first time tRPS after performing the write operation, the enable signal REF2 corresponding to the reference resistor R12 may be activated at a time t5. Here, the time t5 may come after the time t2 (see FIG. 10.).

In addition, at the second time tRPE after performing the write operation, the enable signal REF2 corresponding to the reference resistor R12 may be activated at a time t6. Here, the time t6 may come after the time t2 and the t5.

The refresh period mask signal RPM may be generated using the enable signal REF2 (tRPS) and the enable signal REF2 (tRPE). For example, the refresh period mask signal RPM may also be activated at the activating time of the enable signal REF2 (tRPS) and may be deactivated at the activating time of the enable signal REF2 (tRPE).

Figure 13:
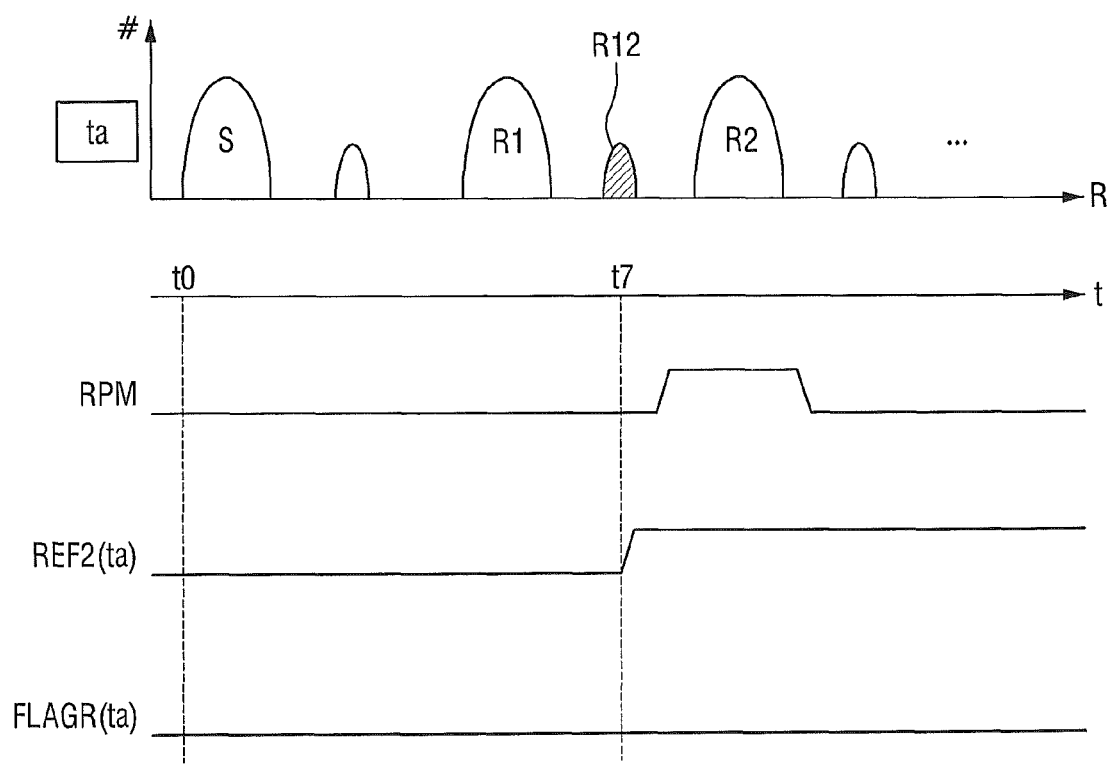
FIGS. 13 and 14 illustrate the operation of the refresh request signal generator shown in FIG. 6 generating a refresh request signal.
Figure 14:
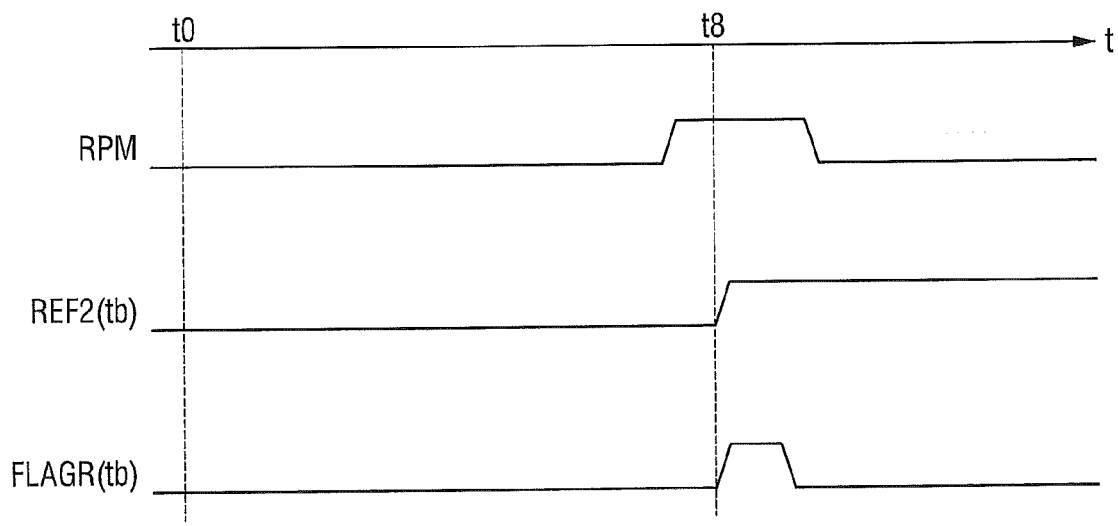

FIGS. 13 and 14 illustrate the operation of the refresh request signal generator shown in FIG. 6 generating a refresh request signal.

In the nonvolatile memory device according to some embodiments of the present inventive concept, when the enable signals REF1 to REFn overlap with the refresh period mask signal RPM (that is, when the enable signals REF1 to REFn are within the preset refresh requiring period), the refresh request signal FLAGR may be generated.

First, referring to FIG. 13, after a third time ta is elapsed after performing the write operation, the enable signal REF2 (ta) corresponding to the reference resistor R12 may be activated at a time t7, for example. However, the activating time t7 of the enable signal REF2 (ta) does not overlap with the refresh period mask signal RPM. That is to say, the refresh operation is not yet required to be performed. Therefore, the refresh request signal FLAGR (ta) is not activated.

Next, referring to FIG. 14, after a fourth time tb is elapsed after performing the write operation, the enable signal REF2 (tb) corresponding to the reference resistor R12 may be activated at a time t8, for example. However, the activating time t8 of the enable signal REF2 (tb) overlaps with the refresh period mask signal RPM. That is to say, because the refresh operation is required to be performed, the refresh request signal FLAGR (ta) is activated. The controller 21 receives the refresh request signal FLAGR (tb) and stores the data and address of the resistive memory cell.

Figure 15:
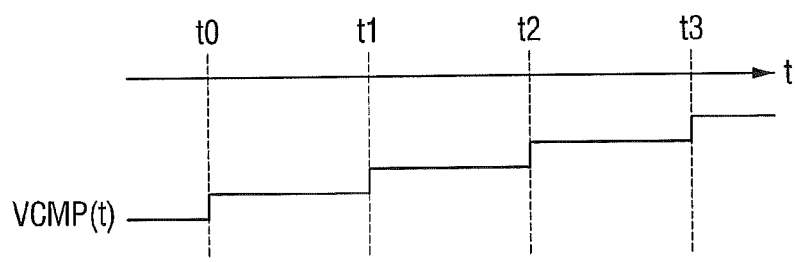
FIGS. 15 to 17 illustrate exemplary clamping biases in nonvolatile memory devices according to some embodiments of the present inventive concept.
Figure 16:
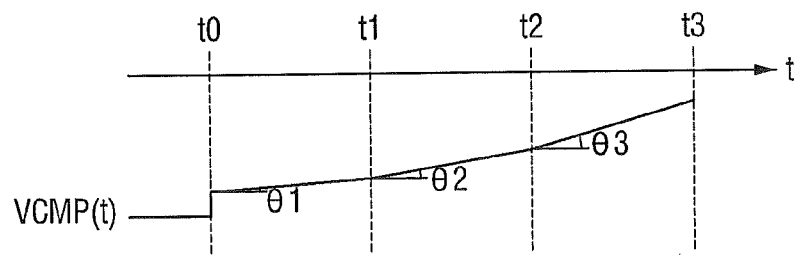
Figure 17:
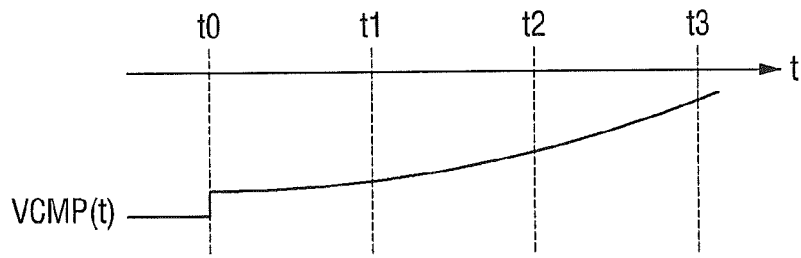

FIGS. 15 to 17 illustrate exemplary clamping biases in nonvolatile memory devices according to some embodiments of the present inventive concept.

As shown in FIG. 15, the clamping bias VCMP(t) may be increased stepwise with time.

As shown in FIG. 16, the clamping bias VCMP(t) may have different slopes for the respective time periods. For example, the slope of the clamping bias VCMP(t) is θ1 between t0 and t1, the slope of the clamping bias VCMP(t) is θ2 between t1 and t2, and the slope of the clamping bias VCMP(t) is θ3 between t2 and t3. θ2 may be greater than θ1 and θ3 may be greater than θ2, but aspects of the present inventive concept are not limited thereto.

As shown in FIG. 17, the clamping bias VCMP(t) may also be increased with time in the form of a kth-order equation, where k is a natural number. In FIG. 17, the clamping bias VCMP(t) increasing in the form of a second order equation is illustrated by way of example, but aspects of the present inventive concept are not limited thereto.

Figure 18A:
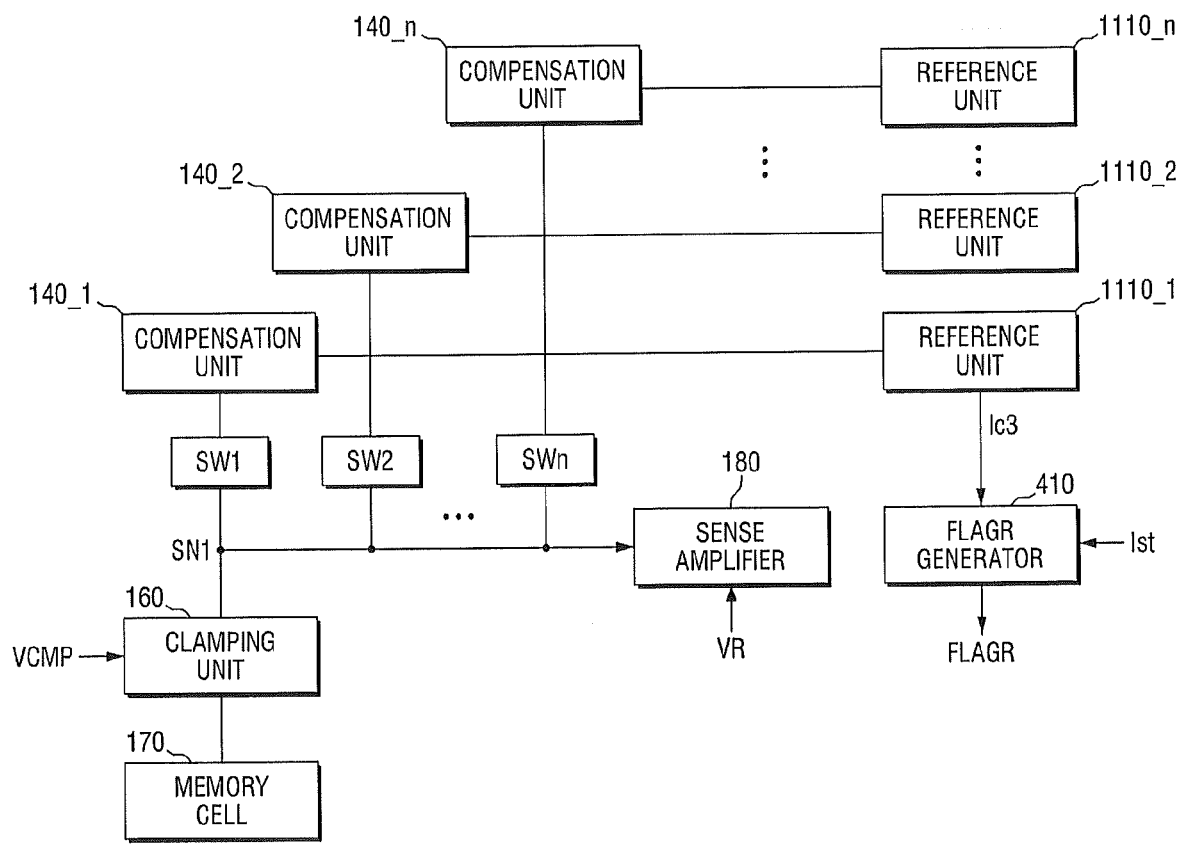
FIG. 18A is a block diagram of a nonvolatile memory device according to some embodiments of the present inventive concept and FIG. 18B is an exemplary circuit view of the nonvolatile memory device shown in FIG. 18B.
Figure 18B:
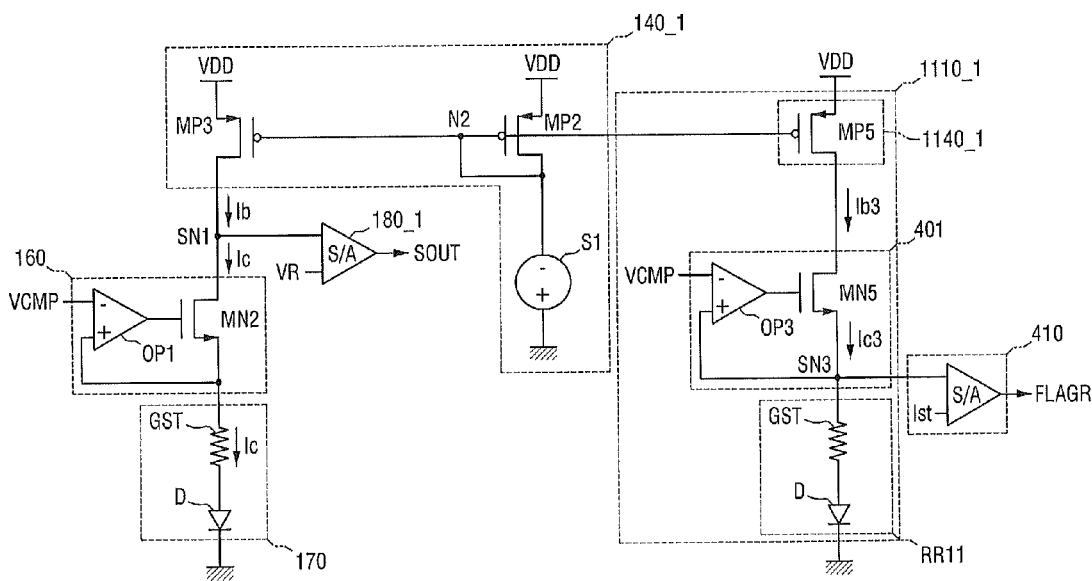

FIG. 18A is a block diagram of a nonvolatile memory device according to some embodiments of the present inventive concept and FIG. 18B is an exemplary circuit view of the nonvolatile memory device shown in FIG. 18B. For brevity, FIG. 18B illustrates only one first compensation unit 140_1, a switch SW1 and only one reference unit 1110_1. The same description of operations and elements as those of FIGS. 6 and 7 will be omitted.

Referring to FIGS. 18A and 18B, the nonvolatile memory device according to another embodiment of the present inventive concept may include a resistive memory cell 170, a first sensing node SN1, first compensation units 140_1 to 140_n, a plurality of switches SW1 to SWn, a first clamping unit 160, first sense amplifier 180, a plurality of reference units 1110_1 to 1110_n, and a refresh request signal generator 410.

The first sensing node SN1 has a first compensation current Ib flowing in from the first compensation units 140_1 to 140_n and a cell current Ic flowing out to the first compensation units 140_1 to 140_n. The cell current Ic flows through the resistive memory cell 170.

The first clamping unit 160 is connected between the resistive memory cell 170 and the first sensing node SN1 and clamps levels of bit lines to be in an appropriate range for a read operation. Here, the first clamping bias VCMP may not vary with time and may be substantially constant.

During a read operation, one (e.g., SW1) of the plurality of switches SW1 to SWn may be selectively turned on. Therefore, one (e.g., 140_1) of the plurality of first compensation units 140_1 to 140_n may be electrically connected to the first sensing node SN1. That is to say, one of the plurality of first compensation units 140_1 to 140_n is selectively electrically connected the first sensing node SN1 according to the data to be read.

In addition, the plurality of reference units 1110_1 to 1110_n may be connected to the plurality of first compensation units 140_1 to 140_n, As shown in FIG. 18A, the plurality of reference units 1110_1 to 1110_n may be matched with the plurality of first compensation units 140_1 to 140_n in one-to-one correspondence.

As shown in FIG. 18B, the reference unit 1110_1 may include a reference resistor RR11, a third sensing node SN3, a third compensation unit 1140_1, and a third clamping unit 401. The reference current Ic3 may flow through the reference resistor R11.

Because the first compensation unit 140_1 and the third compensation unit 1140_1 are in forms of current mirrors, the first compensation current Ib and the third compensation current Ib3 may be approximately equal to each other.

The refresh request signal generator 410 compares the reference current Ic3 with a preset reference current Ist and generates a refresh request signal FLAGR for the resistive memory cell according to the comparison result.

The reference resistor R11 may be increased due to the resistance drift. If the reference resistor R11 is increased, the reference current Ic3 may be reduced. Therefore, if the reference current Ic3 is smaller than the preset reference current Ist, the refresh request signal generator 410 may determine that a refresh operation is required and may generate the refresh request signal FLAGR. The reference current may be determined in advance through a test operation. That is to say, the reference current may be a preset value determined before performing the read operation.

FIGS. 19 to 23 illustrate memory systems using nonvolatile memory devices according to some embodiments of the present inventive concept.

Figure 19:
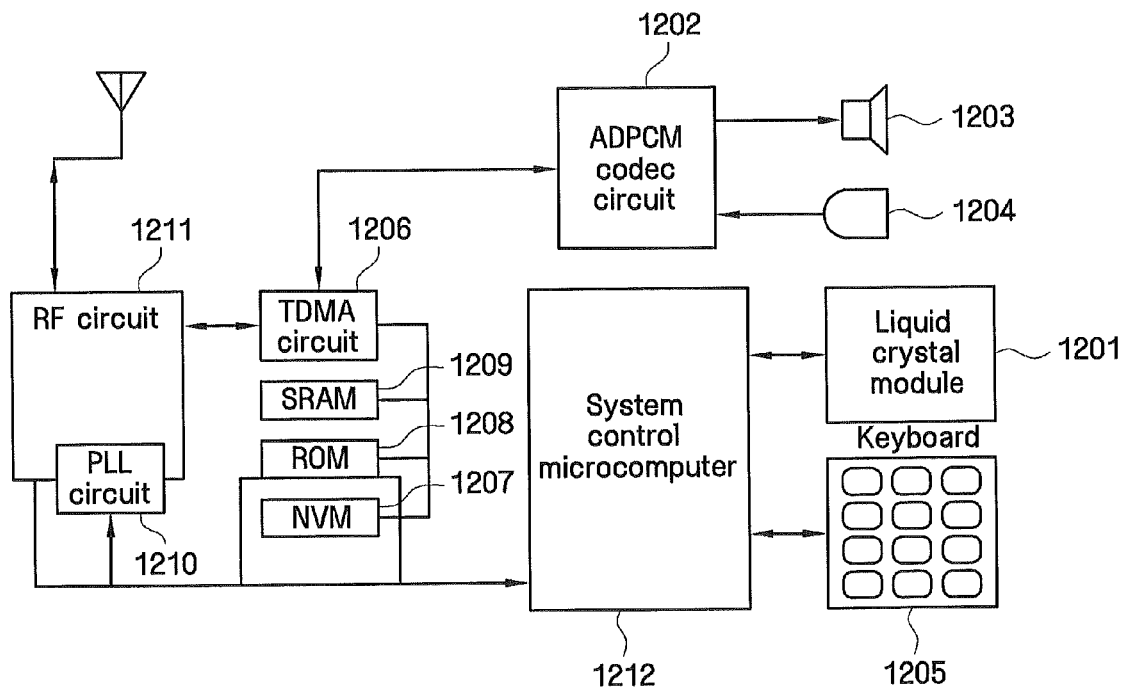
FIGS. 19 to 23 illustrate memory systems using nonvolatile memory devices according to some embodiments of the present inventive concept.

FIG. 19 is an exemplary block diagram of a cellular phone system using a nonvolatile memory device according to embodiments of the present inventive concept.

Referring to FIG. 19 the cellular phone system may include a ADPCM codec circuit 1202 for audio compression or decompression, a speaker 1203, a microphone 1204, a TDMA circuit 1206 for time-divisional multiplexing accessing to digital data, a PLL circuit 1210 for setting a carrier frequency of an RF signal, and an RF circuit 1211 for transmitting/receiving the RF signal.

In addition, the cellular phone system may include various kinds of memories including, for example, a nonvolatile memory 1207, ROM 1208, and SRAM 1209. The nonvolatile memory 1207 may be nonvolatile memory devices according to embodiments of the present inventive concept, and may include, for example, ID number. The ROM 1208 may store programs, and the SRAM 1209 may serve as the working area for a system controlling microcomputer 1212 or may temporarily store data. Here, the system controlling microcomputer 1212 may be a processor controlling write and read operations of the nonvolatile memory 1207.

Figure 20:
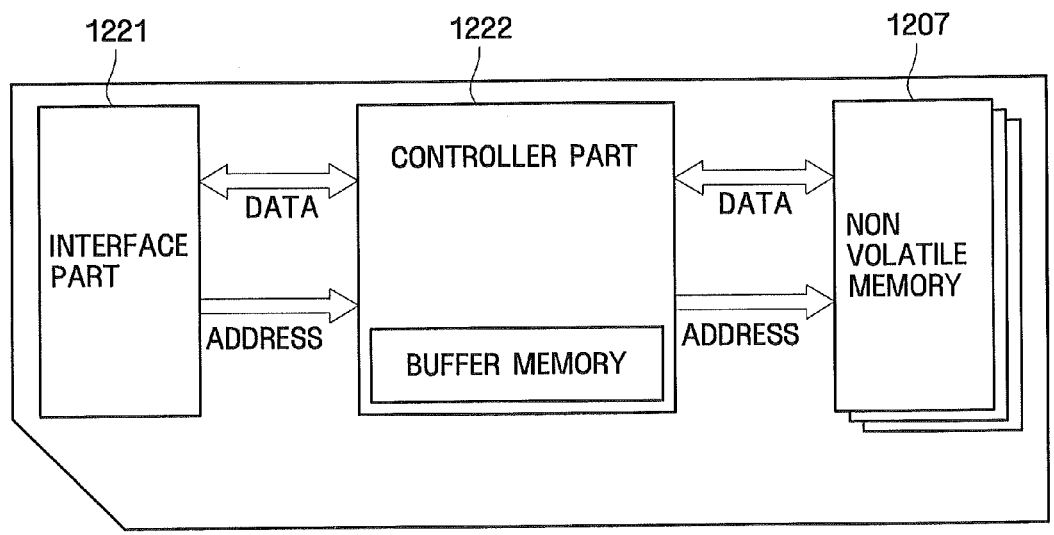

FIG. 20 is an exemplary block diagram of a memory card using a nonvolatile memory device according to embodiments of the present inventive concept.

Referring to FIG. 20, the memory card may include, for example, a multimedia card (MMC), a secure digital (SD) card, a micro SD card, a multiuse card, such as a memory stick, a compact SD card, an ID card, a personal computer memory card international association (PCMCIA) card, an SSD card, a chip card, a smart card, a USB card, and so on.

Referring to FIG. 20, the memory card may include at least one of an interface part 1221 performing interfacing with an external device, a controller part 1222 having a buffer memory and controlling the operation of a memory card, and the nonvolatile memory 1207 according to the embodiments of the present inventive concept. The controller part 1222 may be a processor capable of controlling the write and read operations of the nonvolatile memory 1207. In detail, the controller part 1222 may be coupled to the nonvolatile memory 1207 and the interface part 1221 through a data bus DATA and an address bus ADDRESS.

Figure 21:
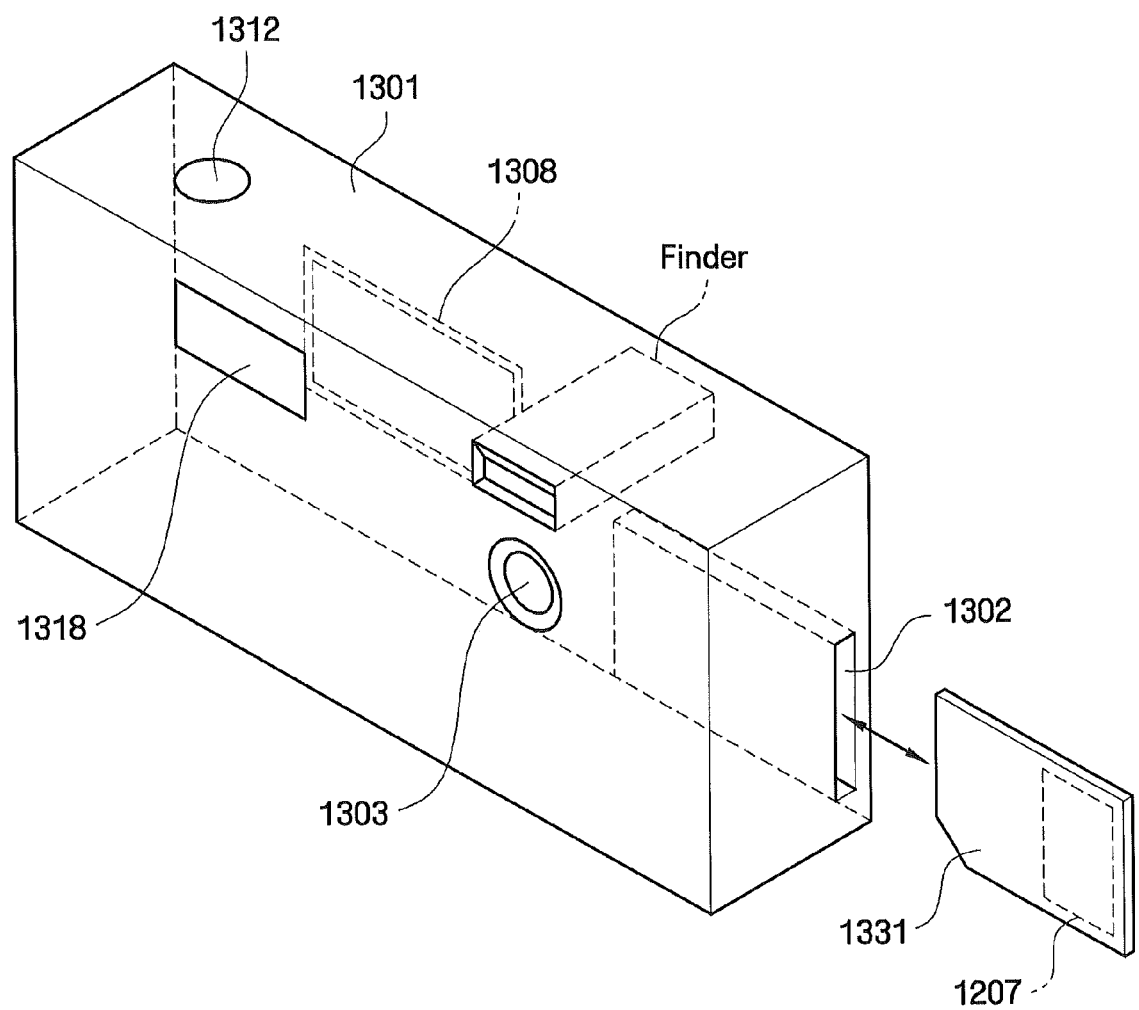

FIG. 21 is an exemplary block diagram of a digital still camera using a nonvolatile memory device according to embodiments of the present inventive concept.

Referring to FIG. 21, the digital still camera may include a body 1301, a slot 1302, a lens 1303, a display 1308, a shutter button 1312, and a strobe 1318. In particular, a memory card 1331 may be inserted into the slot 1308. The memory card 1331 may include at least one nonvolatile memory 1207 according to embodiments of the present inventive concept.

When the memory card 1331 is of a contact type, the memory card 1331 may come into contact with a particular electric circuit provided on a circuit board when it is inserted into the slot 1308. When the memory card 1331 is of a non-contact type, the memory card 1331 may perform communication through an RF signal.

Figure 22:
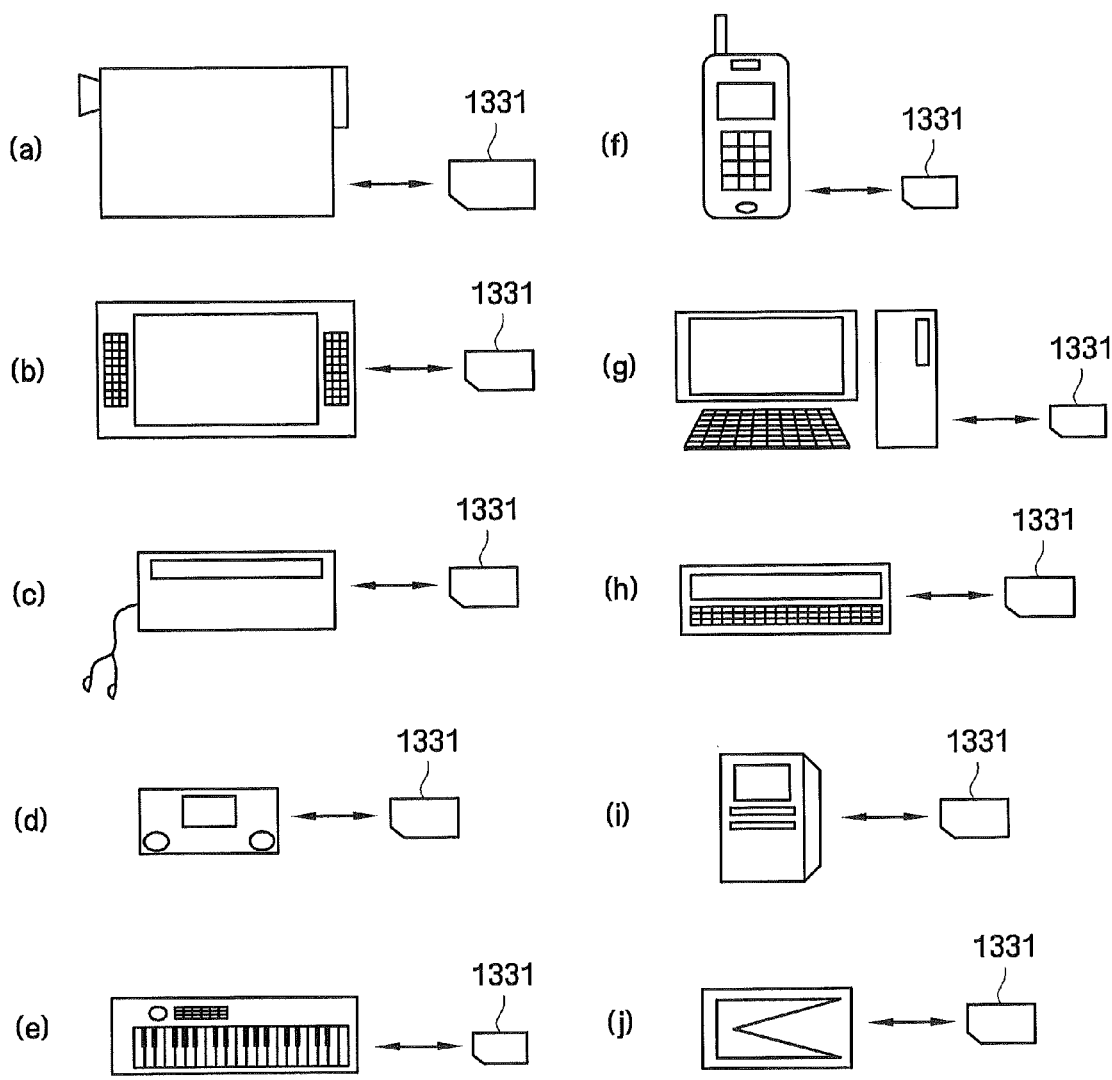

FIG. 22 illustrates various systems using the memory card shown in FIG. 20.

Referring to FIG. 22, the memory card 331 may be used in various systems including (a) a video camera, (b) a television, (c) an audio device, (d) a game console, (e) an electronic music player device, (f) a mobile phone, (g) a computer, (h) a personal digital assistant (PDA), (i) a voice recorder, (j) a PC card, and so on.

Figure 23:
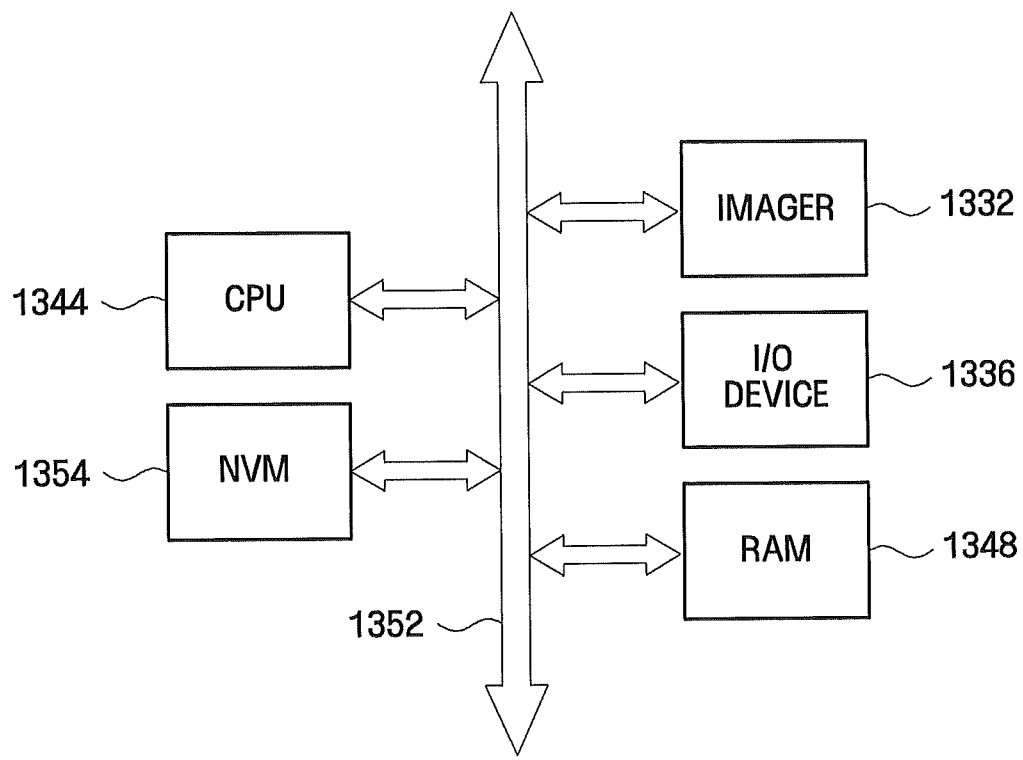

FIG. 23 is an exemplary block diagram of an image sensor system using a nonvolatile memory device according to embodiments of the present inventive concept.

Referring to FIG. 23, the image sensor system may include an image sensor 1332, an input/output (I/O) device 1336, an RAM 1348, a CPU 1344, and a nonvolatile memory 1354 according to embodiments of the present inventive concept. The respective components, that is, the image sensor 1332, the I/O device 1336, the RAM 1348, the CPU 1344, and the nonvolatile memory 1354, may communicate with each other through a bus 1352. The image sensor 1332 may include a photo sensing element, such as a photo gate, a photo diode, and so on. The respective components may be incorporated into a single chip together with the processor, and the processor and the respective components may be configured as separate chips.

Figure 24:
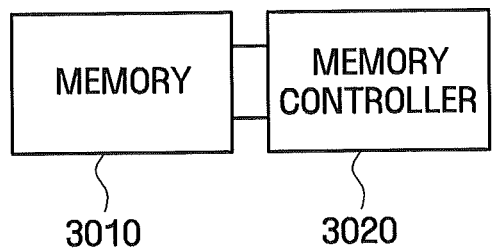
FIG. 24 is an exemplary block diagram of a memory system using a nonvolatile memory device according to embodiments of the present inventive concept.

FIG. 24 is an exemplary block diagram of a memory system using a nonvolatile memory device according to embodiments of the present inventive concept.

As shown in FIG. 24, the memory (system) 3010 is coupled to a memory controller 3020. The memory 3010 may be any one of the memories according to the above-described embodiments. The memory controller 3020 supplies input signals for controlling the operation of the memory 3010. For example, the memory controller 3020 may transmit a command CMD and an address signal to the memory 3010. The memory controller 3020 may include a memory interface, a host interface, an ECC circuit, a central processing unit (CPU), a buffer memory, and so on. The memory interface may transmit data from the buffer memory to the memory 3010 or may read data from the memory 3010 to then transmit the read data to the buffer memory. In addition, the memory interface may transmit the command CMD and the address signal from an external host to the memory 3010.

The host interface may communicate with an external host through one of various interface protocols such as universal serial bus (USB), small computer small interface (SCSI) protocol, peripheral component interconnection (PCI)-express protocol, advanced technology electronics (ATA) protocol, parallel-ATA protocol, serial-ATA (SATA) protocol, serial attached SCSI (SAS), and so on.

The memory according to embodiments of the present inventive concept may include an ECC circuit. The ECC circuit may generate parity bits using data transmitted to the memory 3010. The generated parity bits and data may be stored in a particular area of the memory 3010. The ECC circuit detects an error of data read from the memory 3010. If the detected error is a correctable error, the ECC circuit corrects the data.

The CPU controls the external host or the memory 3010 through the host interface or the memory interface. The CPU may control write, read or erase operations according to firmware for driving the memory 3010.

The buffer memory temporarily stores write data supplied from an external source or data read from the memory 3010. In addition, the buffer memory may store meta data or cache data to be stored in the memory 3010. During an abrupt power-off operation, the meta data or cache data stored in the buffer memory may be stored in the memory 3010. The buffer memory may be a DRAM or an SRAM.

Figure 25:
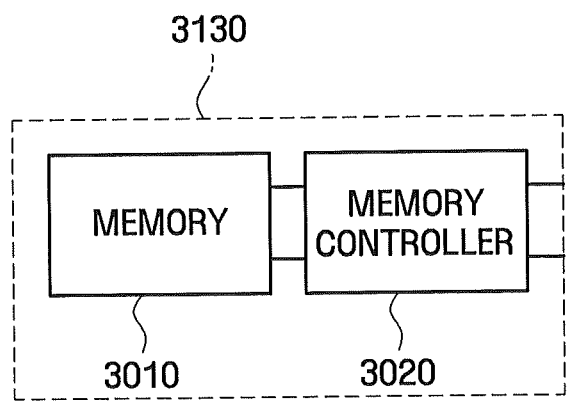
FIG. 25 is another exemplary block diagram of a memory system using a nonvolatile memory device according to embodiments of the present inventive concept.

FIG. 25 is another exemplary block diagram of a memory system using a nonvolatile memory device according to embodiments of the present inventive concept. The memory (system) 3010 according to the illustrated embodiment is substantially the same as the memory shown in FIG. 24, except that the memory 3010 and a memory controller 3020 are embedded in a card 3130. For example, the card 3130 may be a flash memory card. That is to say, the card 3130 may be a standard product used in a consumer electronic device, such as a digital camera, a personal computer, and so on. The memory controller 3020 may control the memory 3010 according to a control signal supplied from another device (i.e., an external device).

Figure 26:
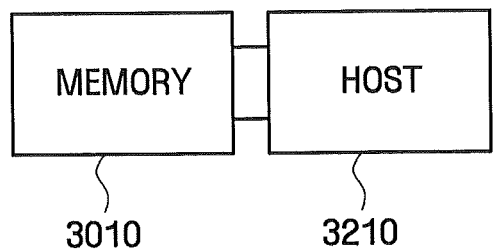
FIG. 26 is still another exemplary block diagram of a memory system using a nonvolatile memory device according to embodiments of the present inventive concept.

FIG. 26 is still another exemplary block diagram of a memory system using a nonvolatile memory device according to embodiments of the present inventive concept. As shown in FIG. 26, the memory (system) 3010 may be coupled to a host 3210. The host 3210 may be a processing system, such as a personal computer, a digital camera, and so on. The host 3210 may use the memory 3010 as an erasable storage device. As described above, the host 3210 may supply input signals for controlling the memory 3010. For example, the host 3210 may supply a command CMD and an address signal.

Figure 27:
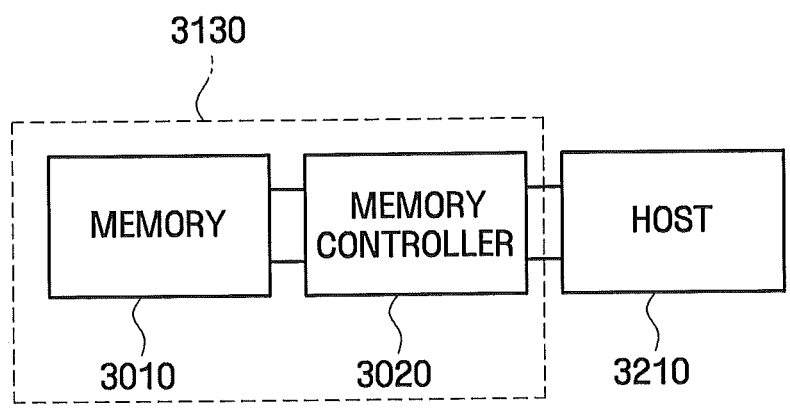
FIG. 27 is still another exemplary block diagram of a memory system using a nonvolatile memory device according to embodiments of the present inventive concept.

FIG. 27 is still another exemplary block diagram of a memory system using a nonvolatile memory device according to embodiments of the present inventive concept. A host 3210 and a card 3130 are coupled to each other. The host 3210 supplies a control signal to the card 3130 to allow the memory controller 3020 to control the memory (system) 3010.

Figure 28:
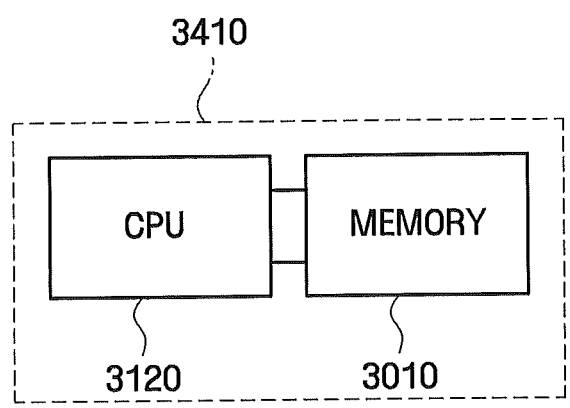
FIG. 28 is still another exemplary block diagram of a memory system using a nonvolatile memory device according to embodiments of the present inventive concept.

FIG. 28 is still another exemplary block diagram of a memory system using a nonvolatile memory device according to embodiments of the present inventive concept. The memory (system) 3010 may be incorporated into a CPU 3120 provided in a computer system 3410. For example, the computer system 3410 may be a personal computer, PDA, etc. The memory 3010 may be directly connected to the CPU 3120 through a bus.

The nonvolatile memory device according to embodiments of the present inventive concept may be used as a storage class memory (SCM). The SCM is a general memory having a nonvolatile characteristic and an accessing characteristic. The SCM may be used as a data storage area and a program operating area.

The above-described nonvolatile memory device using a resistance material, such as PRAM, RRAM or MRAM, may be used as the SCM. The SCM may be used as a data storage memory, in place of a flash, or as a main memory, in place of SRAM. An SCM may replace a flash and SRAM.

Figure 29:
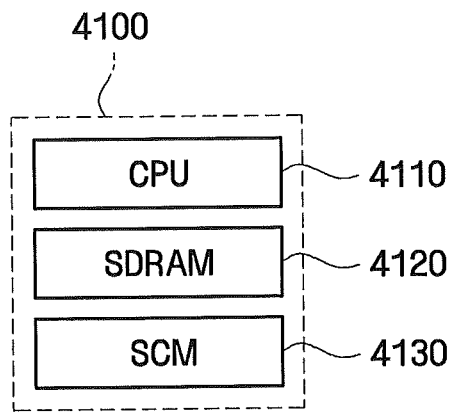
FIG. 29 is an exemplary block diagram illustrating a memory system using a storage class memory (SCM)

FIG. 29 is an exemplary block diagram illustrating a memory system using a storage class memory (SCM). The memory (system) 4100 includes a CPU 4110, an SDRAM 4120 and an SCM 4130 used in place of a flash.

In the memory 4100, a data access speed of the SCM 4130 is higher than that of the flash. For example, when the CPU 4110 operates at 4 GHz under the PC environment, data accessing of PRAM, a kind of the SCM 4130, is approximately 32 times faster than that of the flash. Therefore, the memory 4100 may achieve a higher-speed access gain than a memory incorporating the flash.

Figure 30:
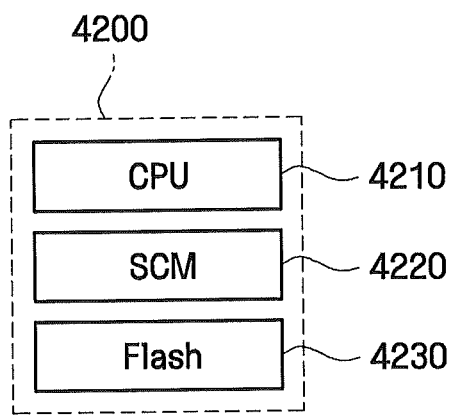
FIG. 30 is another exemplary block diagram illustrating a memory system using a storage class memory (SCM)

FIG. 30 is another exemplary block diagram illustrating a memory system using a storage class memory (SCM). The memory (system) 4200 includes a CPU 4210, an SCM 4220 used in place of SDRAM, and a flash 4230.

In the memory 4200, the SCM 4220 uses a smaller amount of power than the SDRAM. The energy used by a main memory of the computer system is approximately 40% the energy used by the overall system. Thus, people try to reduce the energy used by the main memory. The use of the SCM may reduce dynamic energy consumption by approximately 53% and power dissipation by approximately 73%. As the result, the memory 4200 may considerably reduce energy consumption, compared to the memory using SDRAM.

Figure 31:
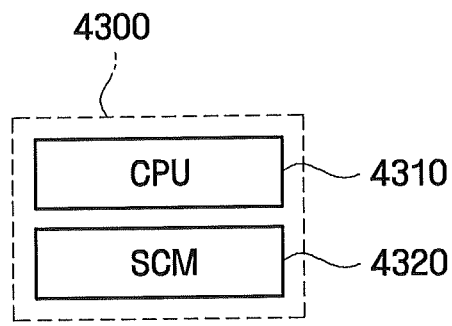
FIG. 31 is another exemplary block diagram illustrating a memory system using a storage class memory (SCM).

FIG. 31 is another exemplary block diagram illustrating a memory system using a storage class memory (SCM). The memory (system) 4300 includes a CPU 4310 and an SCM 4320 used in place of an SDRAM 4120 and a flash 4230. The SCM 4320 may be used as a main memory, instead of the SDRAM, and may used as a data storage memory, instead of the flash 4230. The memory 4300 is advantageous in view of data access speed, low power consumption, space utilization, and cost efficiency.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A nonvolatile memory device comprising:
a resistive memory cell;
a reference resistor corresponding to the resistive memory cell;
a reference sense amplifier electrically connected to the reference resistor and configured to generate a reference output signal based on the reference resistor; and
a refresh request signal generator configured to output a refresh request signal for the resistive memory cell responsive to the reference output signal and a refresh period mask signal, the refresh period mask signal being indicative of a time period in which the resistive memory cell is in need of refresh.

2. The nonvolatile memory device of claim 1, further comprising a controller that stores data and an address of the resistive memory cell responsive to the refresh request signal.

3. The nonvolatile memory device of claim 1, wherein the time period is determined through a test operation.

4. The nonvolatile memory device of claim 1, further comprising a normal sense amplifier electrically connected to the resistive memory cell and configured to generate a normal output signal based on data stored in the resistive memory cell, wherein the normal sense amplifier performs a sensing operation responsive to a transition of the reference output signal of the reference sense amplifier.

5. The nonvolatile memory device of claim 1, wherein a memory cell array including the resistive memory cell has a cross point structure.

6. The nonvolatile memory device of claim 2, wherein the controller provides the stored data and the address to the nonvolatile memory device to perform a refresh operation.

7. The nonvolatile memory device of claim 4, further comprising a first clamping unit connected between the resistive memory cell and a first sensing node and providing a first clamping bias to the resistive memory cell, the first clamping bias varying with time, wherein when the resistive memory cell stores first data, the normal output signal of the normal sense amplifier transitions at a first time after a time of starting providing of the first clamping bias, and when the resistive memory cell stores second data different from the first data, the normal output signal of the normal sense amplifier transitions at a second time different from the first time after the time of starting providing of the first clamping bias.

8. The nonvolatile memory device of claim 7, further comprising a second clamping unit connected between the resistive memory cell and a second sensing node and providing a second clamping bias to the resistive memory cell, the second clamping bias varying with time.

9. The nonvolatile memory device of claim 8, wherein the first clamping bias and the second clamping bias are approximately equal to each other.

10. A nonvolatile memory device comprising:
a resistive memory cell;
a reference resistor which corresponds to the resistive memory cell and having a reference current that flows therethrough; and
a refresh request signal generator configured to compare the reference current with a preset reference current and generating a refresh request signal for the resistive memory cell according to a comparison result between the reference current and the preset reference current;
wherein a first compensation current associated with the resistive memory cell and a second compensation current associated with the reference resistor are approximately equal to each other.

11. The nonvolatile memory device of claim 10, wherein the reference current is determined through a test operation.

12. A memory system comprising:
a nonvolatile memory device including a resistive memory cell, a reference resistor corresponding to the resistive memory cell, a reference sense amplifier electrically connected to the reference resistor and configured to generate a reference output signal based on the reference resistor, and a refresh request signal generator configured to output a refresh request signal for the resistive memory cell responsive to the reference output signal and a refresh period mask signal, the refresh period mask signal being indicative of a time period in which the resistive memory cell is in need of refresh; and
a controller configured to refresh the resistive memory cell responsive to the refresh request signal.

13. The memory system of claim 12, wherein the time period is determined through a test operation.

14. A memory system, comprising:
a resistive memory cell having a reference resistor associated therewith;
a reference unit that generates a reference signal; and
a refresh request signal generator that is configured to generate a refresh request signal for the resistive memory cell responsive to the reference signal,
wherein the resistive memory cell is configured to perform a refresh operation responsive to the refresh request signal;
wherein the refresh request signal generator is further configured to generate the refresh request signal responsive to the reference signal and a refresh period mask signal, the refresh period mask signal being indicative of a time period in which the resistive memory cell is in need of refresh.

15. The memory system of claim 14, wherein the refresh request signal generator is further configured to generate the refresh request signal responsive to a transition of the reference signal during the time period in which the resistive memory cell is in need of refresh.

16. The memory system of claim 14, wherein the time period in which the resistive memory cell is in need of refresh is predetermined through a test operation.

* * * * *